United States Patent
Osame et al.

(10) Patent No.: US 7,247,995 B2
(45) Date of Patent: Jul. 24, 2007

(54) SEMICONDUCTOR DEVICE

(75) Inventors: Mitsuaki Osame, Atsugi (JP); Aya Anzai, Tsukui (JP); Yu Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 327 days.

(21) Appl. No.: 10/860,759

(22) Filed: Jun. 4, 2004

(65) Prior Publication Data

US 2004/0256996 A1     Dec. 23, 2004

(30) Foreign Application Priority Data

Jun. 18, 2003   (JP) .............................. 2003-174041

(51) Int. Cl.
*G09G 3/10* (2006.01)

(52) U.S. Cl. ...................... 315/169.1; 345/205; 257/66

(58) Field of Classification Search ............ 315/169.1, 315/169.3, 381; 257/66, 72; 348/748, 761; 345/205, 212, 76

See application file for complete search history.

(56) References Cited

U.S. PATENT DOCUMENTS

| | | | | |
|---|---|---|---|---|
| 6,049,228 | A * | 4/2000 | Moon | 326/81 |
| 6,084,579 | A | 7/2000 | Hirano | 345/205 |
| 6,281,520 | B1 * | 8/2001 | Yamazaki | 257/66 |
| 6,636,520 | B1 * | 10/2003 | Jason et al. | 370/401 |
| 2001/0055841 | A1 | 12/2001 | Yamazaki et al. | 438/169 |
| 2002/0047568 | A1 | 4/2002 | Koyama | 345/205 |
| 2002/0068388 | A1 | 6/2002 | Murakami et al. | 757/59 |
| 2002/0153844 | A1 | 10/2002 | Koyama | 345/205 |
| 2004/0012550 | A1 | 1/2004 | Koyama | 345/205 |

FOREIGN PATENT DOCUMENTS

| | | |
|---|---|---|
| EP | 1 063 630 | 12/2000 |
| JP | 2001-005426 | 1/2001 |
| JP | 2002-057162 | 2/2002 |
| JP | 3281848 | 2/2002 |
| JP | 2002-108285 | 4/2002 |
| JP | 2004-126513 | 4/2004 |

OTHER PUBLICATIONS

Specification, Claims, Abstract, and Filing Receipt for Application Serial No. 10/453,940 Filed Jun. 4, 2003 to Yamazaki et al.

* cited by examiner

*Primary Examiner*—Tuyet V. Tran
*Assistant Examiner*—Jimmy Vu
(74) *Attorney, Agent, or Firm*—Eric J. Robinson; Robinson Intellectual Property Law Office, P.C.

(57) ABSTRACT

A semiconductor device in which electrostatic discharge damage during manufacturing steps is prevented. More specifically, a semiconductor device in which electrostatic discharge damage during a step in which the formation of a pixel electrode is completed is prevented. A semiconductor device of the invention comprises a light emitting element, a driving transistor and a protection means disposed between the light emitting element and the driving transistor. The protection means comprises as least one of a resistor element, a capacitor element and a rectifier element. More specifically, the protection means is disposed between a pixel electrode of the light emitting element and a source electrode or a drain electrode of the driving transistor. It is to be noted that the rectifier element is an element having a rectifying function and corresponds to a diode or a transistor whose drain electrode and gate electrode are connected to each other.

32 Claims, 21 Drawing Sheets

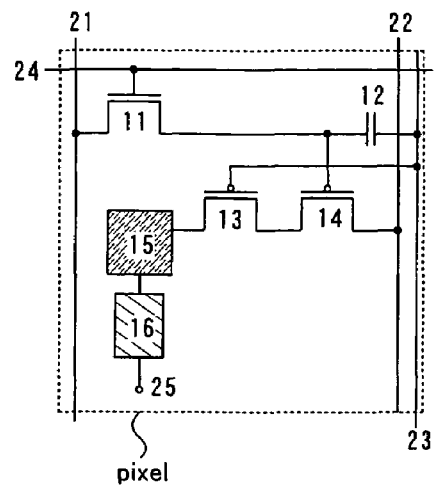
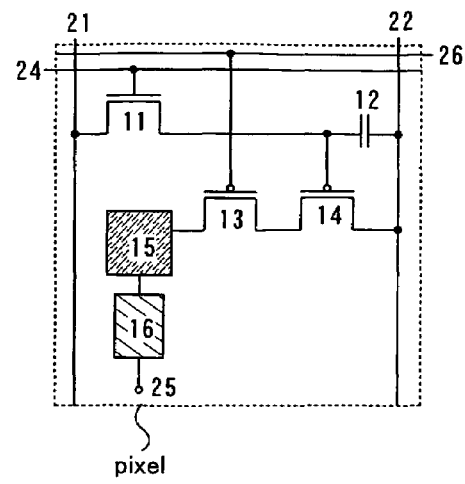
FIG.1A  FIG.1B
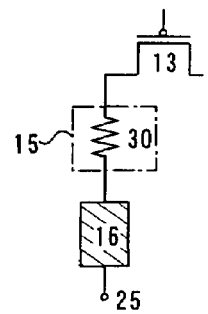 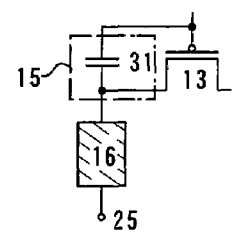 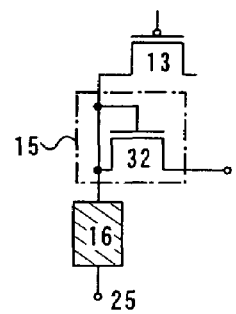
FIG.1C  FIG.1D  FIG.1E
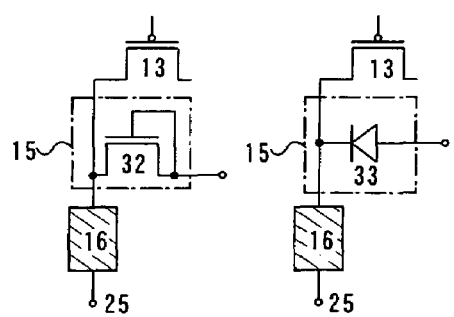 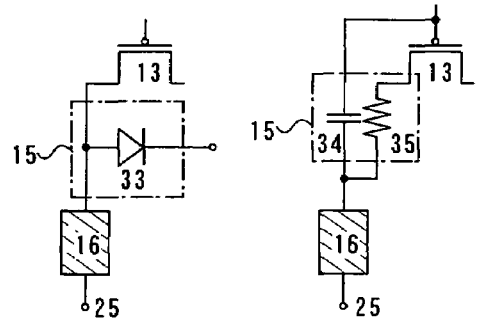
FIG.1F  FIG.1G  FIG.1H  FIG.1I

SEMICONDUCTOR DEVICE

BACKGROUND OF THE INVENTION

1. Field of the Invention

The present invention relates to a semiconductor device using a semiconductor element such as a transistor, and more specifically relates to a semiconductor device provided with a protection means in order to prevent electrostatic discharge damage.

2. Description of the Related Art

Static electricity builds up, developing due to friction, contact and the like with air and objects such as conductors, semiconductors and insulators. When there are an excess of charges on these materials, electrostatic discharge is caused, and in the case where this condition occurs on a free node such as an input terminal, minute semiconductor elements formed on a substrate are degraded or destroyed. This is referred to as electrostatic discharge damage. In order to prevent such electrostatic discharge damage, a circuit formed on a substrate (hereinafter referred to as an internal circuit) is connected to an external IC (hereinafter referred to as an external circuit) via a protection circuit and an FPC. The protection circuit detects voltage and current supplied from the external circuit to the internal circuit, and controls the voltage and current to prevent the internal circuit from being damaged when a malfunction occurs.

In recent years, a semiconductor device including a light emitting element has been actively developed. This semiconductor device has the features such as fast response, superior dynamic display and wide viewing angle, as well as the advantages of a conventional liquid crystal display device. The semiconductor device comprises a plurality of pixels each including a light emitting element and a transistor, and in each of the pixels, the transistor connected in series to the light emitting element controls light emission or non-light emission of the light emitting element.

As a transistor for driving the light emitting element, a crystalline semiconductor (polysilicon) is preferably used because of the high field effect mobility. A transistor using polysilicon, however, tends to have variations in characteristics due to defects in crystal grain boundaries. Accordingly, the drain current of the transistor differs in each pixel even when the same signal voltage is inputted, leading to variations in luminance. In order to reduce such variations in luminance, a driving transistor may be operated in a saturation region to supply a drain current corresponding to a voltage $V_{GS}$ between a gate and a source (see Patent Document 1 for example).

[Patent Document 1]
 Japanese Patent Laid-Open No. 2002-108285

SUMMARY OF THE INVENTION

When forming a semiconductor device including a light emitting element, a transistor is formed on a substrate first, and then a light emitting element is formed. More specifically, a transistor is formed on a substrate first, and wirings are formed so as to be electrically connected to a source region and a drain region of the transistor. Subsequently, a pixel electrode of the light emitting element is formed so as to be electrically connected to the wirings. The pixel electrode is exposed at this time, thus static electricity is likely to be built up on the pixel electrode. In particular, during manufacturing steps involving charged particles, such as dry etching and electron beam evaporation, the pixel electrode functions as an antenna and thus electrostatic discharge damage is easily induced. Sudden discharge of electric charges that have built up in the pixel electrode leads to degradation or destruction of a semiconductor element connected to the pixel electrode. Further, when transporting a substrate in which manufacturing steps up to the formation of a pixel electrode are completed, the pixel electrode on the substrate is exposed, and therefore, electrostatic discharge damage may be caused via the pixel electrode in the case where static electricity occurs during transporting the substrate.

In view of the foregoing, the invention provides a semiconductor device including a light emitting element, in which electrostatic discharge damage during manufacturing steps is prevented. More specifically, the invention prevents electrostatic discharge damage of a semiconductor device in which manufacturing steps up to the formation of a pixel electrode are completed.

A drain current $I_{DS}$ of a driving transistor in a saturation region is represented by the formula $I_{DS}=\beta(V_{GS}-V_{TH})^2/2$. As can be expected from this formula, the drain current $I_{DS}$ is significantly affected by a slight variation in voltage $V_{GS}$ between a gate and a source. That is, the voltage $V_{GS}$ between a gate and a source of a driving transistor has to be kept at a constant value during a period in which a light emitting element emits light. Therefore, it is necessary to increase capacitance of a capacitor element provided between a gate and a source of a driving transistor or to lower off-current of a switching transistor. However, increasing the capacitance while lowering the off-current is difficult in manufacturing steps.

In view of the foregoing, the invention provides a semiconductor device in which variations in luminance of light emitting elements due to variations in characteristics of driving transistors are reduced without increasing capacitance of a capacitor element provided between a gate and a source of a driving transistor or lowering off-current of a switching transistor.

To solve the aforementioned problems, the invention will take the following measures.

A semiconductor device according to the invention comprises a light emitting element, a driving transistor, and a protection means (protection circuit) disposed between the light emitting element and the driving transistor, and the protection means comprises at least one of a resistor element, a capacitor element and a rectifier element. More specifically, the protection means is disposed between a pixel electrode of the light emitting element and a source electrode or a drain electrode of the driving transistor. It is to be noted that the driving transistor controls the amount of current flowing in the light emitting element, and corresponds to a transistor whose source electrode or drain electrode is directly connected to the pixel electrode of the light emitting element in the case where the protection means is not provided. Further, the rectifier element has a rectifying function and corresponds to a diode or a transistor whose drain electrode and gate electrode are connected to each other.

When using a resistor element as a protection means, the resistor element is disposed between a pixel electrode and a source electrode or a drain electrode of a transistor. According to this, electric charges built up on the pixel electrode are prevented from being supplied to the transistor at a time and directly, and thus, sudden changes in potential of the source electrode or the drain electrode of the transistor are avoided. The resistor element has a resistance value of a few tens of kΩ to a few hundreds of kΩ at this time, and more preferably, 20 to 50 kΩ. Alternatively, the resistor element may have a resistance value of 1% or less of that of a light emitting element.

When using a capacitor element as a protection means, the capacitor element charges or discharges electric charges built up on a pixel electrode and divides the electric charges between the capacitor element and a transistor. According to this, sudden changes in potential of a source electrode or a drain electrode of the transistor are avoided. The capacitor element has a capacitance value of a few tens of fF to a few hundreds of fF at this time, and more preferably, 100 to 200 fF.

When using as a protection means a transistor whose drain electrode and gate electrode are connected to each other and whose source electrode is connected to a power supply line, electric charges built up on a pixel electrode are discharged to the power supply line, thereby setting the pixel electrode potential to be equal to the power supply line potential or the relevant potential. In such a manner, sudden changes in potential of a source electrode or a drain electrode of a transistor due to electric charges built up on the pixel electrode are avoided.

When using as a protection means a diode either electrode of which is connected to a pixel electrode and the other electrode of which is connected to a power supply line, electric charges built up on the pixel electrode are discharged to the power supply line, thereby setting the pixel electrode potential to be equal to the power supply line potential. In such a manner, sudden changes in potential of a source electrode or a drain electrode of a transistor due to electric charges built up on the pixel electrode are avoided.

The invention adopting the aforementioned structures mitigates sudden changes in potential of a source electrode or a drain electrode of a transistor due to electric charges built up on a pixel electrode, which prevents electrostatic discharge damage. The invention also prevents electrostatic discharge damage during manufacturing steps, in particular, during a step in which the formation of a pixel electrode is completed.

According to the invention, a gate electrode of a driving transistor is connected to a wiring with a constant potential, thereby fixing the gate electrode potential. The driving transistor is operated in a saturation region in order to supply current all the time. Further, a current controlling transistor operated in a linear region is additionally connected in series to the driving transistor. A video signal including data of light emission or non-light emission of a pixel is inputted to a gate electrode of the current controlling transistor via a switching transistor.

A voltage between a source and a drain $V_{DS}$ of a current controlling transistor operated in a linear region is small. Therefore, a slight variation in voltage $V_{GS}$ between a gate and a source of the current controlling transistor does not affect the amount of current flowing in a light emitting element. Thus, the amount of current flowing in the light emitting element is determined by a driving transistor operated in a saturation region.

The invention adopting the aforementioned structures provides a semiconductor device in which variations in luminance of light emitting elements due to variations in characteristics of driving transistors are reduced and image quality is thus enhanced, while not increasing capacitance of a capacitor element provided between a gate and a source of a driving transistor or lowering off-current of a switching transistor.

BRIEF DESCRIPTION OF THE DRAWINGS

FIGS. 1A to 1I are circuit diagrams each showing a pixel included in a semiconductor device of the invention.

DETAILED DESCRIPTION OF THE INVENTION

[Embodiment Mode 1]

Figure 2A:
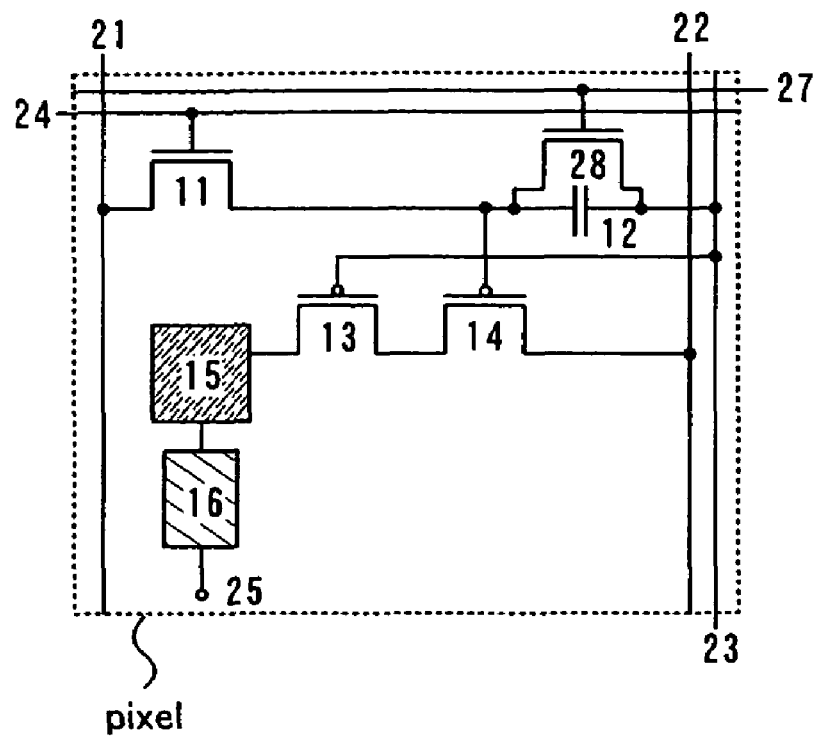
FIGS. 2A and 2B are circuit diagrams each showing a pixel included in the semiconductor device of the invention.

A circuit configuration of a pixel included in the semiconductor device of the invention is described with reference to FIGS. 1A to 11. A pixel shown in FIG. 1A comprises a signal line 21 and power supply lines 22 and 23 arranged in columns and a scan line 24 arranged in rows. The pixel also comprises a switching transistor 11 (hereinafter referred to as a transistor 11), a driving transistor 13 (hereinafter referred to as a transistor 13), a current controlling transistor 14 (hereinafter referred to as a transistor 14), a protection means 15, and a light emitting element 16. One electrode of the light emitting element 16 is connected to a counter power supply 25.

A pixel shown in FIG. 1B has the same configuration as that in FIG. 1A, except that a gate electrode of the transistor 13 is connected to a power supply line 26 arranged in rows. That is, the pixels shown in FIGS. 1A and 1B show the same equivalent circuit diagram. However, in the case where the power supply line 23 is arranged in columns (FIG. 1A), the power supply line 23 is formed of a conductive material of the same layer as the signal line 21 and the power supply line 22. Meanwhile, in the case where the power supply line 26 is arranged in rows (FIG. 1B), the power supply line 26 is formed of a conductive material of the same layer as the scan line 24. In this embodiment mode, the power supply lines 23 and 26 are shown in FIGS. 1A and 1B respectively in order to show that these power supply lines are formed on different layers.

One of the features of the pixels shown in FIGS. 1A and 1B is that the protection means 15 is provided between the transistor 13 and the light emitting element 16. The protection means 15 corresponds to at least one of a resistor element, a capacitor element and a rectifier element. The rectifier element corresponds to a diode or a transistor whose drain electrode and gate electrode are connected to each other.

When using a resistor element 30 as the protection means 15 (FIG. 1C), the resistor element 30 is disposed between a pixel electrode and a source electrode or a drain electrode of the transistor 13 so that electric charges built up on the pixel electrode are not supplied to the transistor directly and at a time. Accordingly, sudden changes in potential of the source electrode or the drain electrode of the transistor 13 can be avoided. At this time, the resistor element 30 has a resistance value of a few tens of kΩ to a few hundreds of kΩ, and more preferably, 20 to 80 kΩ. Alternatively, the resistor element 30 may have a resistance value of 1% or less of that of the light emitting element 16. The resistor element 30 may be formed of semiconductor, metal or the like for forming a gate electrode and a wiring, and the form of the resistor element 30 in a pixel is not especially limited.

When using a capacitor element 31 as the protection means 15 (FIG. 1D), the capacitor element 31 charges or discharges electric charges built up on the pixel electrode, and divides the electric charges between the capacitor element 31 and the transistor 13. Accordingly, sudden changes in potential of the source electrode or the drain electrode of the transistor 13 can be avoided. The capacitor element 31 has a capacitance value of a few tens of fF to a few hundreds of fF, and more preferably, 100 to 200 fF. The capacitor element 31 may be formed of semiconductor, metal or the like for forming a gate electrode and a wiring, and the form of the capacitor element 31 in a pixel is not especially limited. It is to be noted that although one electrode of the capacitor element 31 is connected to the gate electrode of the transistor 13 in FIG. 1D, the invention is not limited to this and it may be connected to a gate electrode of the transistor 14 instead.

When using as the protection means 15 a transistor 32 whose gate electrode and drain electrode are connected to each other and whose source electrode is connected to a wiring (FIGS. 1E and 1F), electric charges built up on the pixel electrode are discharged to the wiring, thereby setting the pixel electrode potential to be equal to the wiring potential or the relevant potential. The wiring corresponds to a wiring to which the source electrode of the transistor 32 is connected, and for example, it corresponds to either of the power supply lines 22, 23 and 26 which are wirings with a constant potential, or a wiring connected to the counter power supply 25. Although an N-type transistor is used for the transistor 32 herein, the invention is not limited to this and a P-type transistor may be used as well. Further, the gate electrode and the drain electrode of the transistor 32 may be connected to one electrode of the light emitting element 16 as shown in FIG. 1E, or the source electrode of the transistor 32 may be connected to one electrode of the light emitting element 16 as shown in FIG. 1F. In this manner, sudden changes in potential of the source electrode or the drain electrode of the transistor 13 due to electric charges built up on the pixel electrode can be avoided.

When using as the protection means 15 a diode 33 one electrode of which is connected to the pixel electrode and the other is connected to a wiring (FIGS. 1G and 1H), electric charges built up on the pixel electrode are discharged to the wiring, thereby setting the pixel electrode potential to be equal to the wiring potential. The wiring corresponds to a wiring to which one electrode of the diode 33 is connected, and for example, it corresponds to either of the power supply lines 22, 23 and 26 with a constant potential, or a wiring connected to the counter power supply 25. As shown in FIGS. 1G and 1H, the direction of the diode 33 is not especially limited. In such a manner, sudden changes in potential of the source electrode or the drain electrode of the transistor 13 due to electric charges built up on the pixel electrode can be avoided.

When using as the protection means 15 a resistor element 35 and a capacitor element 34 (FIG. 1I), the resistor element 35 and the capacitor element 34 mitigate sudden changes in potential of the transistor 13 due to an excess of electric charges built up on the pixel electrode. In this manner, a plurality of elements selected from a group consisting of the resistor element, the capacitor element and the rectifier element may be used as the protection means 15 as well as a single element selected from the same group. That is, the protection circuits shown in FIGS. 1C to 1I may be combined freely.

One of the features of the pixels shown in FIGS. 1A and 1B is that the transistors 13 and 14 are connected in series in the pixel, and the ratio of the channel length $L_{13}$/the channel width $W_{13}$ of the transistor 13 to the channel length $L_{14}$/the channel width $W_{14}$ of the transistor 14 is set as $L_{13}/W_{13}:L_{14}/W_{14}=5$ to 6000:1. For example, this is satisfied when $L_{13}$, $W_{13}$, $L_{14}$, and $W_{14}$ are equal to 500 μm, 3 μm, 3 μm, and 100 μm respectively.

Note that, the transistor 13 is operated in a saturation region and controls the amount of current flowing in the light emitting element 16, whereas the transistor 14 is operated in a linear region and controls the current supply to the light emitting element 16. It is preferable that the transistors 13 and 14 have the same conductivity in view of the manufacturing steps. For the transistor 13, a depletion mode transistor may be used as well as an enhancement mode transistor. According to the aforementioned structures, a slight variation in $V_{GS}$ of the transistor 14 does not affect the amount of current flowing in the light emitting element 16 since the transistor 14 is operated in a linear region. That is, the amount of current flowing in the light emitting element 16 is determined by the transistor 13 operated in a saturation region.

The transistor 11 controls a video signal input to the pixel. When the transistor 11 is turned ON and a video signal is inputted to the pixel, a capacitor element holds the inputted video signal. Note that, a capacitor element may not be provided since a gate capacitor is used as a capacitor for holding a video signal. However, the invention is not limited to this and a capacitor element 12 may be provided explicitly as shown in FIGS. 1A and 1B.

The light emitting element 16 has a structure in which an electro luminescent layer is sandwiched between a pair of electrodes, and a pixel electrode and a counter electrode (anode and cathode) have a potential difference so that a forward bias voltage is applied to the light emitting element 16. The electro luminescent layer is formed by using various materials such as organic materials and inorganic materials. The luminescence in the electro luminescent layer includes luminescence that is generated when an excited singlet state returns to a ground state (fluorescence) and luminescence that is generated when an excited triplet state returns to a ground state (phosphorescence).

As set forth above, the invention comprising the protection means provides a semiconductor device in which sudden changes in potential of a source electrode or a drain electrode of a transistor due to electric charges built up on a pixel electrode are avoided and electrostatic discharge damage is thus prevented. Further, according to the invention, a pixel comprises a driving transistor operated in a saturation region and a current controlling transistor operated in a linear region, and these transistors are connected in series to each other. Thus, the invention provides a semiconductor device in which variations in luminance due to variations in characteristics of transistors are reduced and image quality is thus improved.

[Embodiment Mode 2]

A circuit configuration of a pixel included in the semiconductor device of the invention is described with reference to FIGS. 2A and 2B. A pixel shown in FIG. 2A comprises the signal line 21 and the power supply lines 22 and 23 arranged in columns, and the scan line 24 and a scan line 27 arranged in rows. The pixel further comprises the transistor 11, the transistor 13, the transistor 14, an erasing transistor 28 (hereinafter referred to as a transistor 28), a capacitor element 12, the protection means 15, and the light emitting element 16. One electrode of the light emitting element 16 is connected to the counter power supply 25.

Figure 2B:
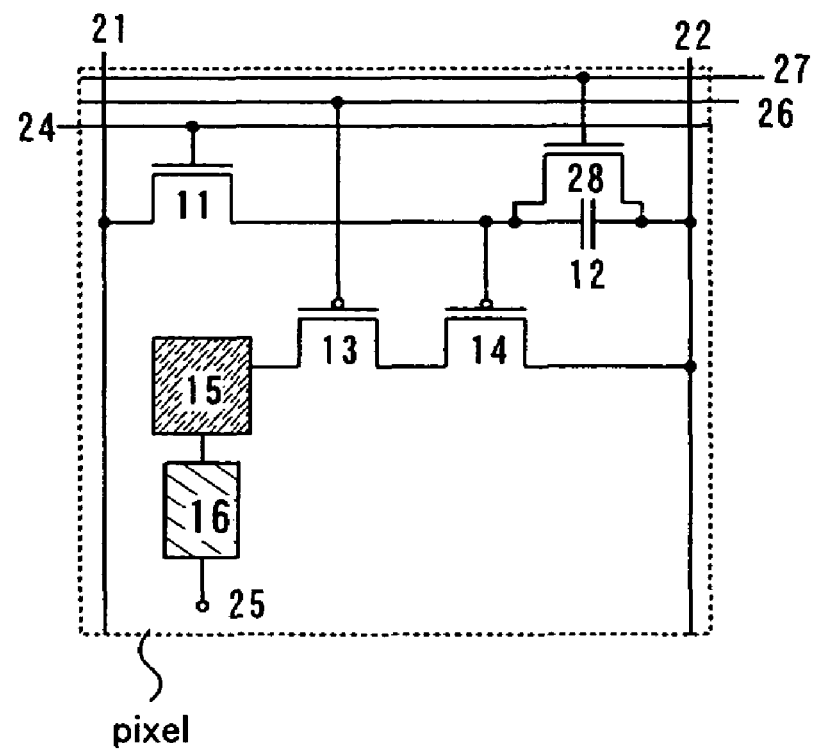

The pixel shown in FIG. 2A has the same configuration as that shown in FIG. 1A, except that the transistor 28 and the scan line 27 are additionally provided, therefore, detailed description thereof is omitted herein. Similarly, a pixel shown in FIG. 2B has the same configuration as that shown in FIG. 1B, except that the transistor 28 and the scan line 27 are additionally provided, therefore, detailed description thereof is omitted herein.

The transistor 28 is controlled to be ON/OFF by the scan line 27 which is additionally provided. When the transistor 28 is turned ON, electric charges held in the capacitor element 12 are discharged, thereby turning the transistor 14 OFF. That is, current supply to the light emitting element 16 can be forcibly stopped in accordance with the transistor 28.

By adopting the aforementioned structure, a lighting period can start simultaneously with or shortly after a writing period before signals are written to all the pixels, leading to increased duty ratio.

[Embodiment Mode 3]

A light emitting element has a structure in which an electro luminescent layer is sandwiched between a pair of electrodes. More specifically, an electro luminescent layer is formed on a patterned first conductive layer (first electrode), and a second conductive layer (second electrode) is formed so as to cover the whole surface of the electro luminescent layer. In this case, heat treatment is preferably performed on the second conductive layer formed over the electro luminescent layer in order to lower the resistance. However, the electro luminescent layer has a low heat resistance and can not withstand heat treatment at a high temperature. Therefore, due to different resistance values, a voltage applied between a pair of electrodes may differ between in the edges and the center of the light emitting element, which may result in degraded image quality and increased power consumption. In view of this problem, an auxiliary conductive layer (wiring) is connected to a conductive layer which is formed over the electro luminescent layer in order to lower the resistance of the conductive layer. Such embodiment mode is described hereinafter with reference to diagrams.

Figure 12A:
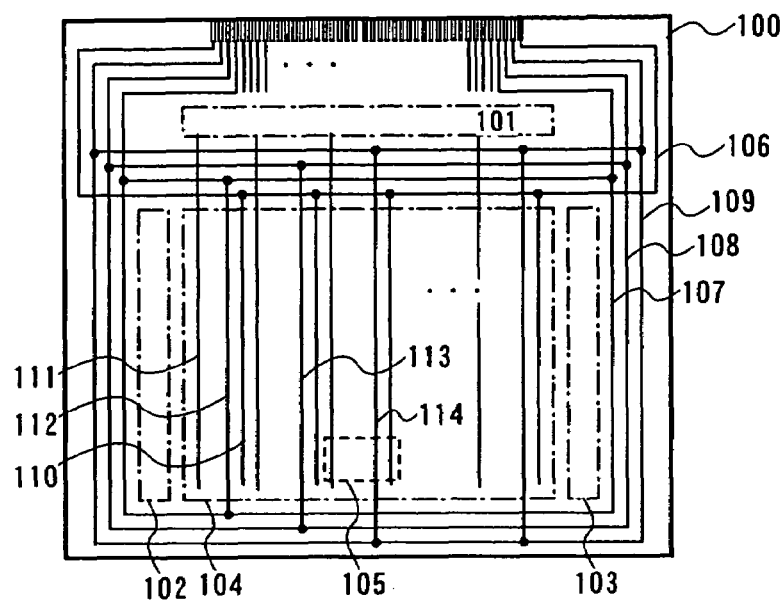
FIGS. 12A and 12B are diagrams each showing a panel and lead wirings of a power supply line.
Figure 12B:
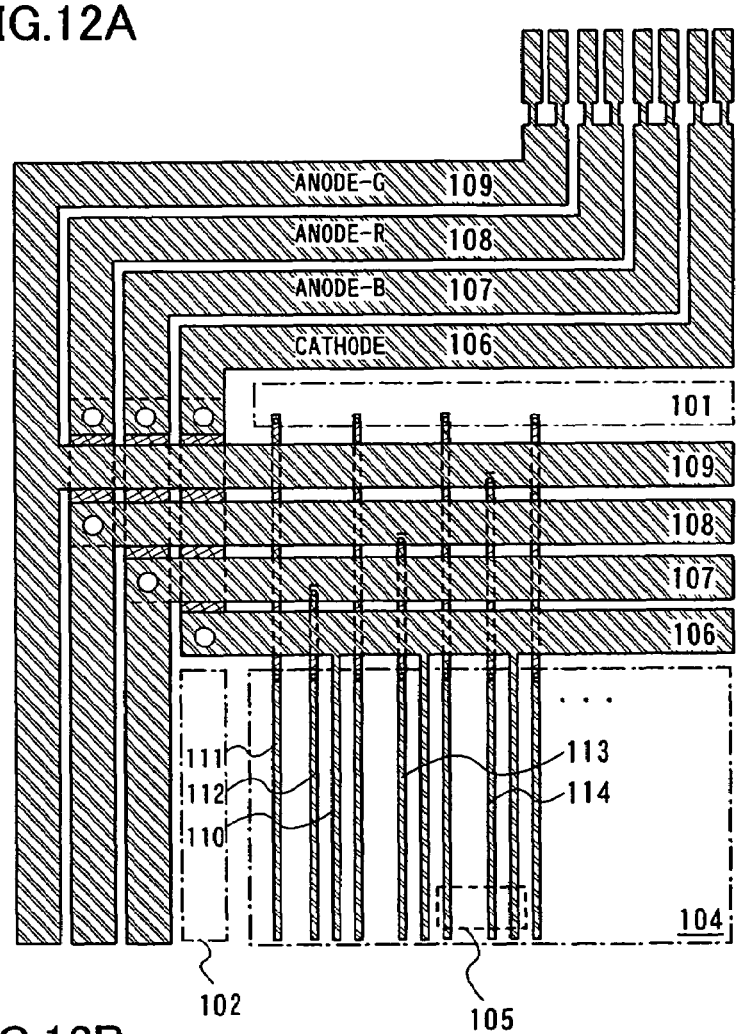

Described with reference to FIGS. 12A and 12B is a leading method of wirings on a panel, in particular, a leading method of a power supply line (hereinafter referred to as an anode line) having the same potential as a high potential voltage VDD and a leading method of a power supply line (hereinafter referred to as a cathode line) having the same potential as a low potential voltage VSS. It is to be noted that only wirings arranged in columns in a pixel portion 104 are shown in FIGS. 12A and 12B.

FIG. 12A is a top plan view of a panel comprising a substrate 100. The pixel portion 104 including a plurality of pixels 105 arranged in matrix is disposed on the substrate 100, and a signal line driving circuit 101 and scan line driving circuits 102 and 103 are arranged at the periphery of the pixel portion 104. The number of these driving circuits is not exclusively limited, and may be changed arbitrarily in accordance with a configuration of the pixels 105.

A signal line 111 arranged in columns in the pixel portion 104 is connected to the signal line driving circuit 101. Similarly, power supply lines 112 to 114 arranged in columns are connected to either of anode lines 107 to 109. Further, an auxiliary wiring 110 arranged in columns is connected to a cathode line 106. The anode lines 107 to 109 and the cathode line 106 are led around the pixel portion 104 and the driving circuits disposed at the periphery thereof, and connected to terminals of an FPC.

Each of the anode lines 107 to 109 corresponds to each of RGB. When applying different potentials to each of the anode lines 107 to 109, variations in luminance between each color can be compensated. That is, a problem in that differences in the current density of an electro luminescent layer of a light emitting element between each color cause variations in luminance between each color even when the same current is supplied can be solved by using the plurality of anode lines. It is to be noted that an electro luminescent layer is divided into colors of RGB here, though the invention is not limited to this. A plurality of anode lines are not required and a single anode line is sufficient when displaying monochrome images or displaying color images by a method in which differences in current density in each color are not to be taken into account, for example by using a white light emitting element in combination with a color filter.

FIG. 12B shows a simple mask layout. In FIG. 12B, the anode lines 107 to 109 and the cathode line 106 are arranged at the periphery of the signal line driving circuit 101, and the anode lines 107 to 109 are connected to the power supply lines 112 to 114 arranged in columns in the pixel portion 104. As shown in the diagram, the cathode line 106 and the auxiliary wiring 110 are formed of a conductive material of the same layer.

After forming the cathode line 106 and the auxiliary wiring 110, a first conductive layer (first electrode) of the light emitting element is formed. Subsequently, an insulating layer (also called a bank) is formed, and an opening portion is provided over the cathode line 106 and the auxiliary wiring 110. The opening portion exposes the cathode line 106 and the auxiliary wiring 110, and an electro luminescent layer is formed at this time so as not to cover the opening portion. Afterwards, a second conductive layer (second electrode) is formed over the electro luminescent layer, the cathode line 106 and the auxiliary wiring 110. Accordingly, the second conductive layer is formed so as to be electrically connected to the cathode line 106 and the auxiliary wiring 110, which is one of the features of this embodiment mode. According to this feature, the resistance of the second conductive layer formed so as to cover the electro luminescent layer can be lowered, and image quality degradation and increased power consumption due to the resistance value of the second conductive layer can be improved. Since the resistance value becomes a problem as a panel is increased in size, this feature is efficient especially in manufacturing a large panel with a few tens of inches in size.

Although the second conductive layer is connected to the cathode line in this embodiment mode, the invention is not limited to this. The second conductive layer may be connected to an anode line, and in this case, a counter electrode of a light emitting element is set to be an anode.

The auxiliary wiring 110 is not necessarily formed of a conductive material of the same layer as the signal line arranged in columns as shown in FIGS. 12A and 12B, and it may be formed of a conductive material of the same layer as a scan line arranged in rows. An opening portion forming a contact between the auxiliary wiring 110 and the second conductive layer may be provided in columns either in punctate or linear shapes, or in combination of punctate and linear shapes. It may also be provided in rows either in punctate or linear shapes, or in combination of punctate and linear shapes. Some examples of them are hereinafter shown and the mask layout of the same is described with reference to FIGS. 13 to 15. It is to be noted that the power supply line 112 is not shown in FIGS. 13 to 15.

Figure 13:
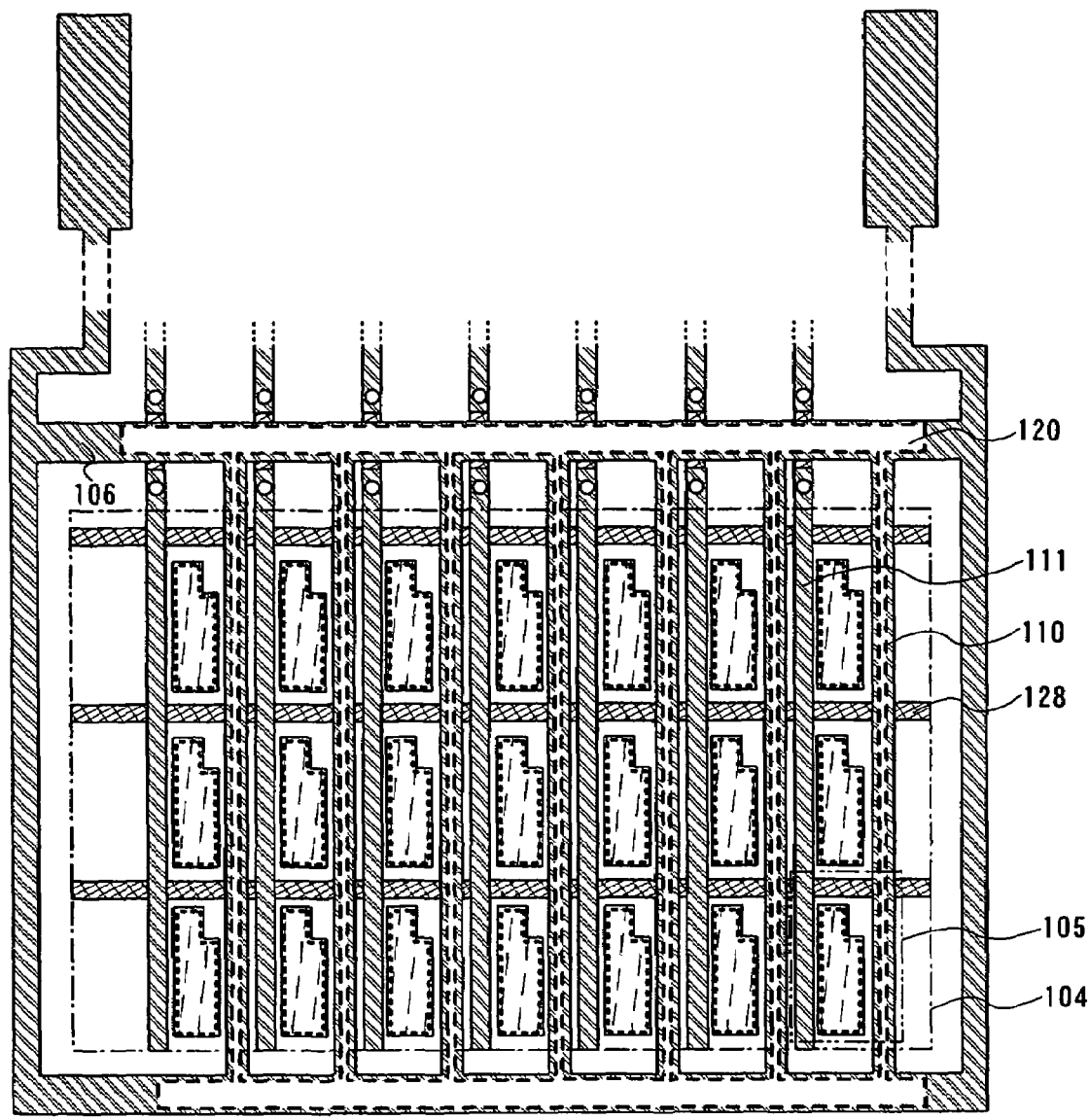
FIG. 13 is a diagram showing a contact portion between an auxiliary wiring and a conductive layer.

Described with reference to FIG. 13 is an example in which the auxiliary wiring 110 and the signal line 111 are formed of a conductive material of the same layer, and the auxiliary wiring 110 is connected to the second conductive layer via a linear opening portion. In FIG. 13, the pixel portion 104 comprises the plurality of pixels 105 arranged in matrix, and the pixel portion 104 also comprises the signal line 111 and the auxiliary wiring 110 arranged in columns, and a scan line 128 arranged in rows. The auxiliary wiring 110 is connected to the cathode line 106. It is to be noted that the auxiliary wiring 110 and the cathode line 106 are wirings formed of a conductive material of the same layer, however, a wiring disposed within the pixel portion 104 is referred to as the auxiliary wiring 110 and a wiring disposed in other area is referred to as the cathode line 106 herein.

A linear opening portion 120 is formed over the cathode line 106 and the auxiliary wiring 110, and the cathode line 106 and the auxiliary wiring 110 are connected to the second conductive layer via the opening portion 120.

Figure 14:
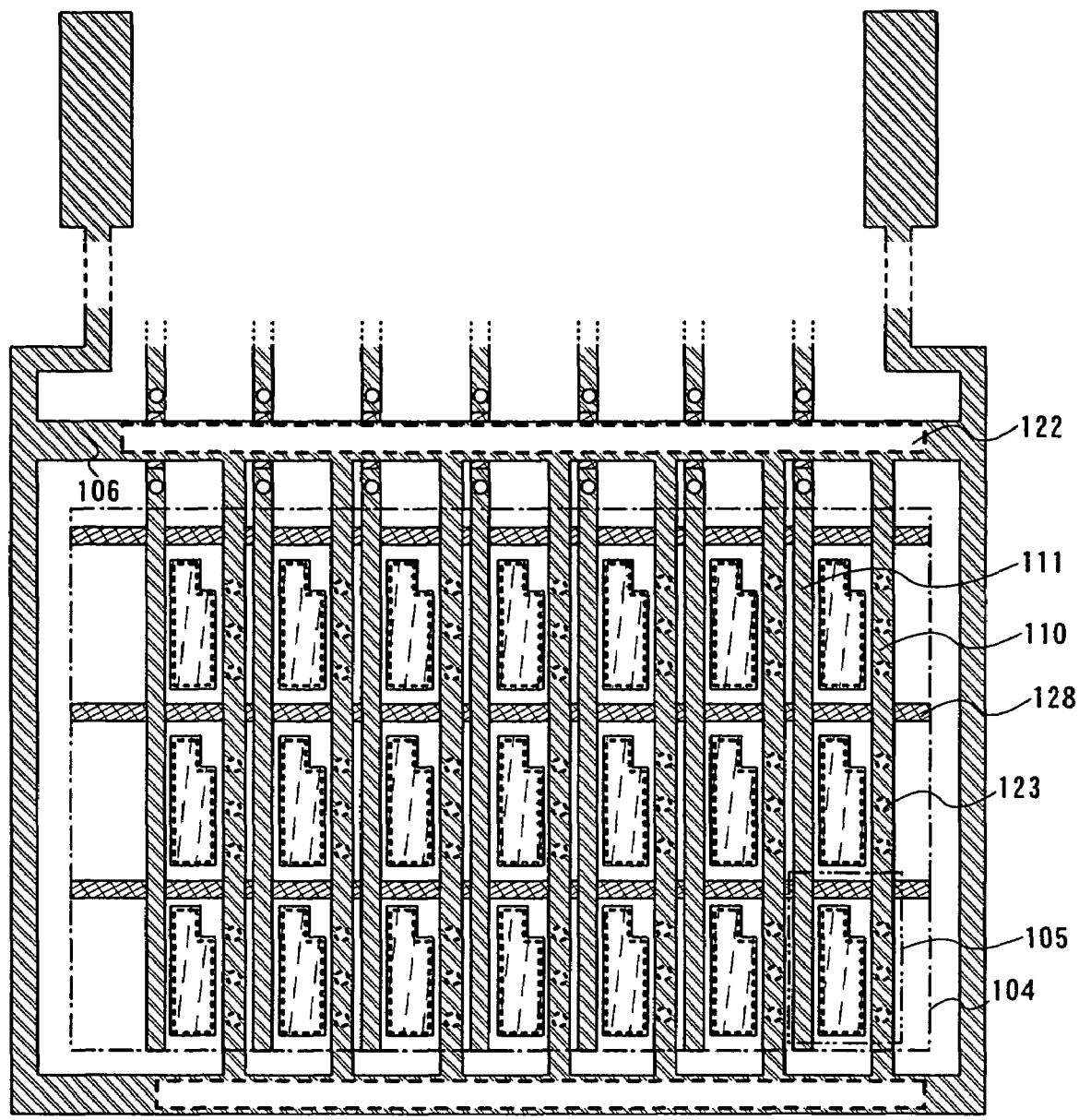
FIG. 14 is a diagram showing a contact portion between an auxiliary wiring and a conductive layer.

Described with reference to FIG. 14 is an example in which a linear opening portion 122 is formed over the cathode line 106, and a punctate opening portion 123 is formed over the auxiliary wiring 110. In this case, the auxiliary wiring 110 is connected to the second conductive layer via the punctate opening portion 123. Except these structures, FIG. 14 is the same as FIG. 13.

Figure 15:
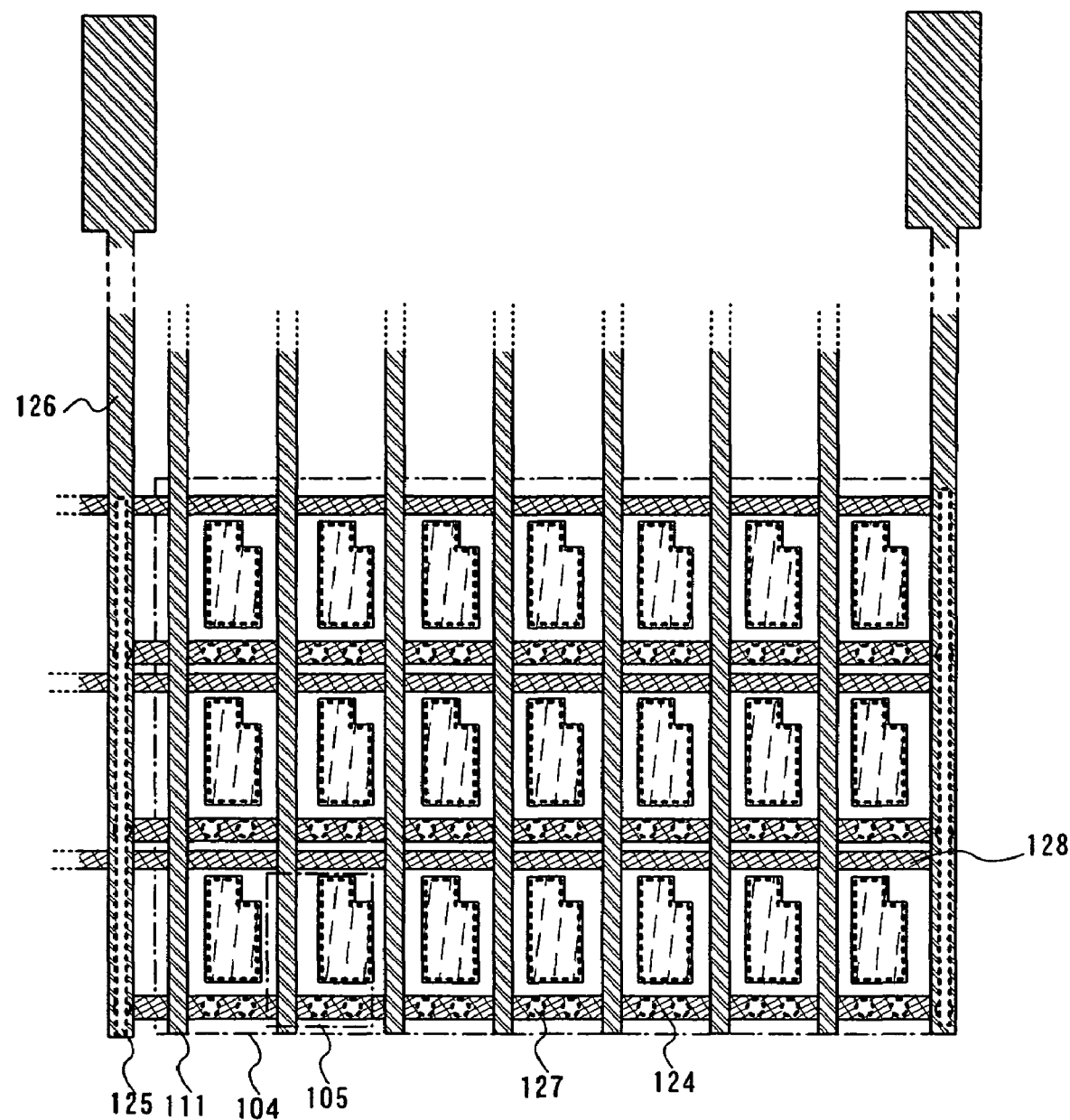
FIG. 15 is a diagram showing a contact portion between an auxiliary wiring and a conductive layer.

Described with reference to FIG. 15 is an example in which an auxiliary wiring 124 and the scan line 128 are formed of a conductive material of the same layer, and the auxiliary wiring 124 is connected to the second conductive layer via a punctate opening portion 127. In FIG. 15, the pixel portion 104 comprises the plurality of pixels 105 arranged in matrix, and the pixel portion 104 also comprises the signal line 111 arranged in columns, and the scan line 128 and the auxiliary wiring 124 arranged in rows. The auxiliary wiring 124 is connected to a cathode line 126. The auxiliary wiring 124 and the cathode line 126 are formed of a conductive material of the different layer and connected to each other via the opening portion.

A linear opening portion 125 is formed over the cathode line 126, and a punctate opening portion 127 is formed over the auxiliary wiring 124. The cathode line 126 and the auxiliary wiring 124 are connected to the second conductive layer via these opening portions 125 and 127.

As set forth above, the auxiliary wiring can be formed either of a conductive material of the same layer as a wiring (e.g., a signal line) arranged in columns as shown in FIGS. 13 and 14, or of a conductive material of the same layer as a wiring (e.g., a scan line) arranged in rows as shown in FIG. 15. These structures do not require an additional mask, therefore, the problem such as increase in production costs and drop in reliability can be avoided. Further, in the case where a punctate opening portion forming a contact between the auxiliary wiring and the second conductive layer is provided at an end of the pixel, reduction in aperture ratio can be suppressed, leading to brighter images.

A cross sectional structure of a substrate including a transistor, a light emitting element and an auxiliary wiring is described with reference to FIGS. 16A and 16B. More specifically, FIG. 16A is a cross sectional view in the case where an auxiliary wiring is formed of the same layer as a wiring arranged in columns, and FIG. 16B is a cross sectional view in the case where an auxiliary wiring is formed of the same layer as a wiring arranged in rows.

Figure 16A:
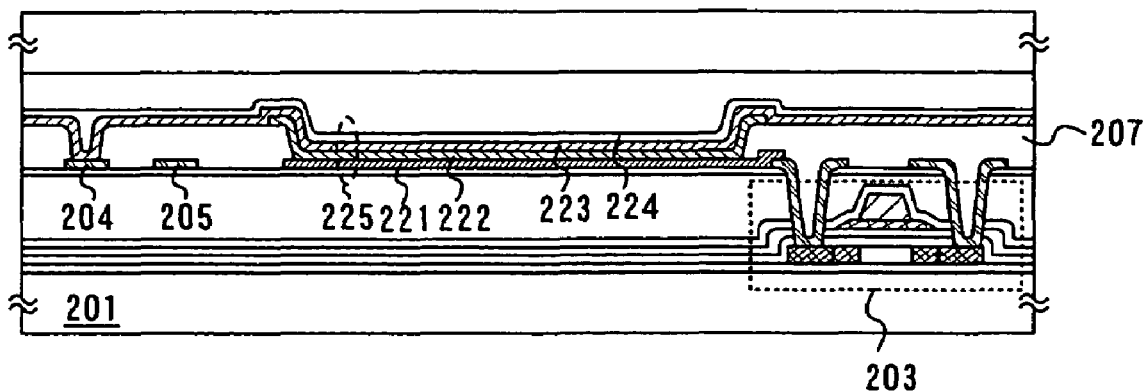
FIGS. 16A and 16B are cross sectional views each showing a transistor and a light emitting element.

In FIG. 16A, a driving transistor 203 is formed over a substrate 201 having an insulating surface, and a first conductive layer (first electrode, pixel electrode) 221, an electro luminescent layer 222 and a second conductive layer (second electrode, counter electrode) 223 are provided so as to be in contact with a source wiring or a drain wiring of the driving transistor 203. An overlapping area of the first conductive layer 221, the electro luminescent layer 222, and the second conductive layer 223 corresponds to a light emitting element 225. A protective layer 224 is formed on the second conductive layer 223.

According to this structure, an auxiliary wiring 204 and a signal line 205 are formed at the same time as the source wiring and the drain wiring of the driving transistor 203. Then, the first conductive layer 221 is formed and an insulating layer 207 is formed thereover. Subsequently, an opening portion is formed in a predetermined area of the insulating layer 207. More specifically, the opening portion is formed over the first conductive layer 221 and the auxiliary wiring 204. After forming the electro luminescent layer 222, a second conductive layer 223 is formed over the whole surface. Since the first conductive layer 221 and the auxiliary wiring 204 are exposed at this time, the second conductive layer 223 is formed over the electro luminescent layer 222 and the auxiliary wiring 204. In this manner, the cross sectional structure shown in FIG. 16A is completed.

Figure 16B:
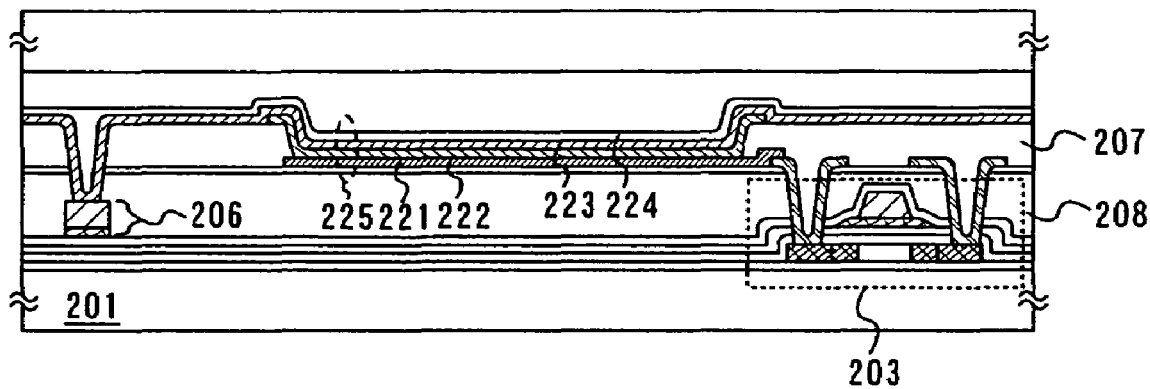

A cross sectional view of FIG. 16B has much the same structure as that of FIG. 16A, except in that an auxiliary wiring 206 is formed of the same layer as a gate electrode of the driving transistor 203. However, when forming the second conductive layer 223, an opening portion has to be formed in the insulating layer 207 and an insulating layer 208 so that the second conductive layer 223 is in contact with the auxiliary wiring 206.

Different cross sectional structures from those in FIGS. 16A and 16B are described with reference to FIGS. 17A and 17B.

Figure 17A:
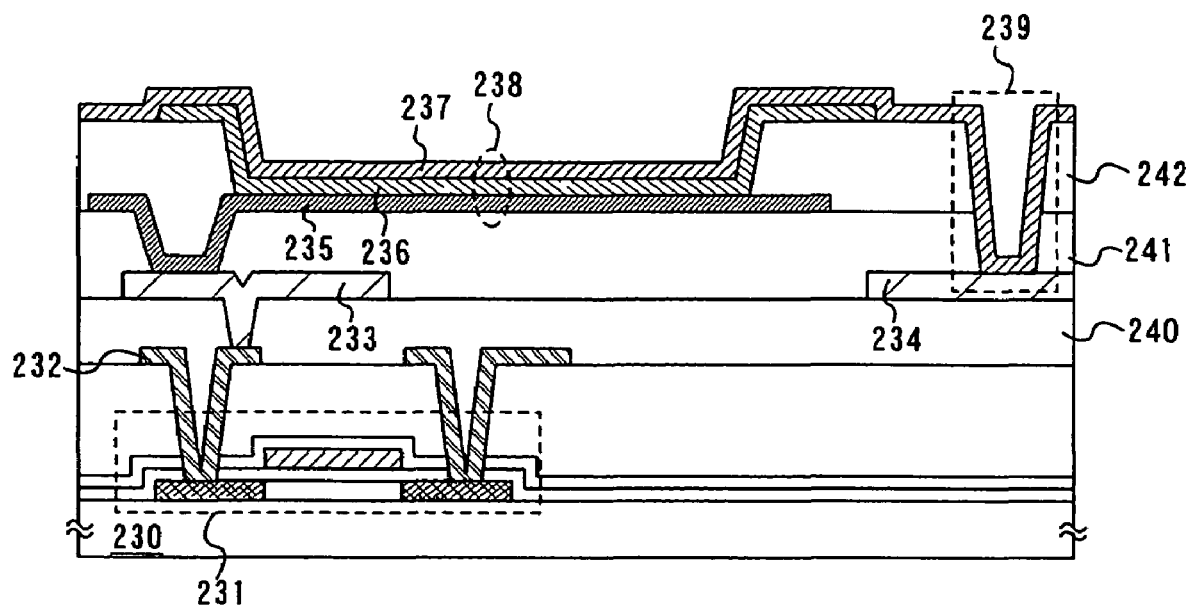
FIGS. 17A and 17B are cross sectional views each showing a transistor and a light emitting element.

In FIG. 17A, a driving transistor 231 is formed over a substrate 230 having an insulating surface, and an insulating layer 240 is formed over a wiring 232 connected to a source electrode or a drain electrode of the driving transistor 231. On the insulating layer 240, a connecting wiring 233 and an auxiliary wiring 234 are formed, and insulating layers 241 and 242 are formed over the connecting wiring 233 and the auxiliary wiring 234. A first conductive layer 235, an electro luminescent layer 236 and a second conductive layer 237 are formed over the insulating layer 241. An overlapping area of the first conductive layer 235, the electro luminescent layer 236, and the second conductive layer 237 corresponds to a light emitting element 238. The auxiliary wiring 234 is connected to the second conductive layer 237 via an opening portion 239.

Figure 17B:
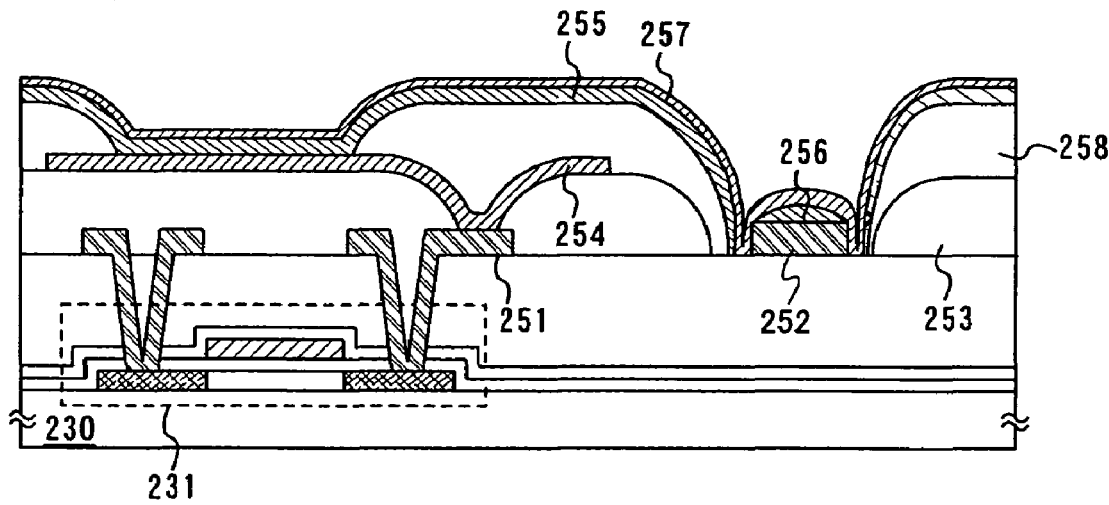

In FIG. 17B, the driving transistor 231 is formed over the substrate 230 having an insulating surface, and an auxiliary wiring 252 and a wiring 251 connected to a source electrode or a drain electrode of the driving transistor 231 are formed thereafter. An insulating layer 253 is formed over the wiring 251 and the auxiliary wiring 252. After forming an opening portion in a predetermined area of the insulating layer 253, a first conductive layer (pixel electrode) 254 is formed, and an insulating layer 258 is formed over the first conductive layer 254. After an opening portion is formed in a predetermined area of the insulating layer 258, electro luminescent layers 255 and 256 are formed. Then, a second conductive layer (counter electrode) 257 is formed over the electro luminescent layers 255 and 256.

According to the structure shown in FIG. 17B, the electro luminescent layer 256 on the auxiliary wiring 252 is thin in thickness and formed by vapor deposition, therefore, the sides of the auxiliary wiring 252 are not covered with the electro luminescent layer 256. Taking advantage of this structure, the second conductive layer 257 is electrically connected to the sides of the auxiliary wiring 252.

Note that, one of the features of the semiconductor device of the invention is that a protection means is provided between a driving transistor and a light emitting element. Though, the protection means is not shown in FIGS. 16A and 16B and FIGS. 17A and 17B.

One of a pair of electrodes of the light emitting element corresponds to an anode, and the other corresponds to a cathode. The anode and the cathode are preferably formed of metal, alloy, electrical conductor compound, or mixture thereof. Further, a material having a high work function is used for the anode whereas a material having a low work function is used for the cathode. An electro luminescent layer is sandwiched between the anode and the cathode, and formed by using various materials such as organic materials and inorganic materials. The luminescence in the electro luminescent layer includes luminescence that is generated when an excited singlet state returns to a ground state (fluorescence) and luminescence that is generated when an excited triplet state returns to a ground state (phosphorescence).

An insulating layer may be formed of either an organic material or an inorganic material. When using an organic material, however, a barrier film such as a silicon nitride film is preferably provided since the organic material has a high hygroscopicity. Among the organic materials, a resist material is preferably used since it is less expensive, has a contact hole with a smaller diameter, and has a lower hygroscopicity as compared with other organic materials such as acryl and polyimide, and thus it requires no barrier film. However, as the resist material is colored, it is preferably used for a top emission display device. Specifically, solution obtained by dissolving cresol resin and the like in solvent (propylene glycol monomethyl ether acetate PGMEA) is coated by a spinner to form the insulating layer.

According to the invention adopting the aforementioned structures, the substantial resistance value of the second conductive layer can be lowered, resulting in reduction in power consumption. Further, defective writing and gray scale due to wiring resistance can be prevented and drop in voltage can be suppressed, thereby applying a constant voltage to the light emitting element. Accordingly, a semiconductor device with improved image quality can be provided. These structures are effective especially in manufacturing a large sized semiconductor device.

[Embodiment]

[Embodiment 1]

An embodiment of the mask layout diagrams of pixels shown in FIGS. 1A to 1I and 2A and 2B is described hereinafter with reference to FIGS. 3 to 5, 10, 11, 18, and 19.

Figure 3:
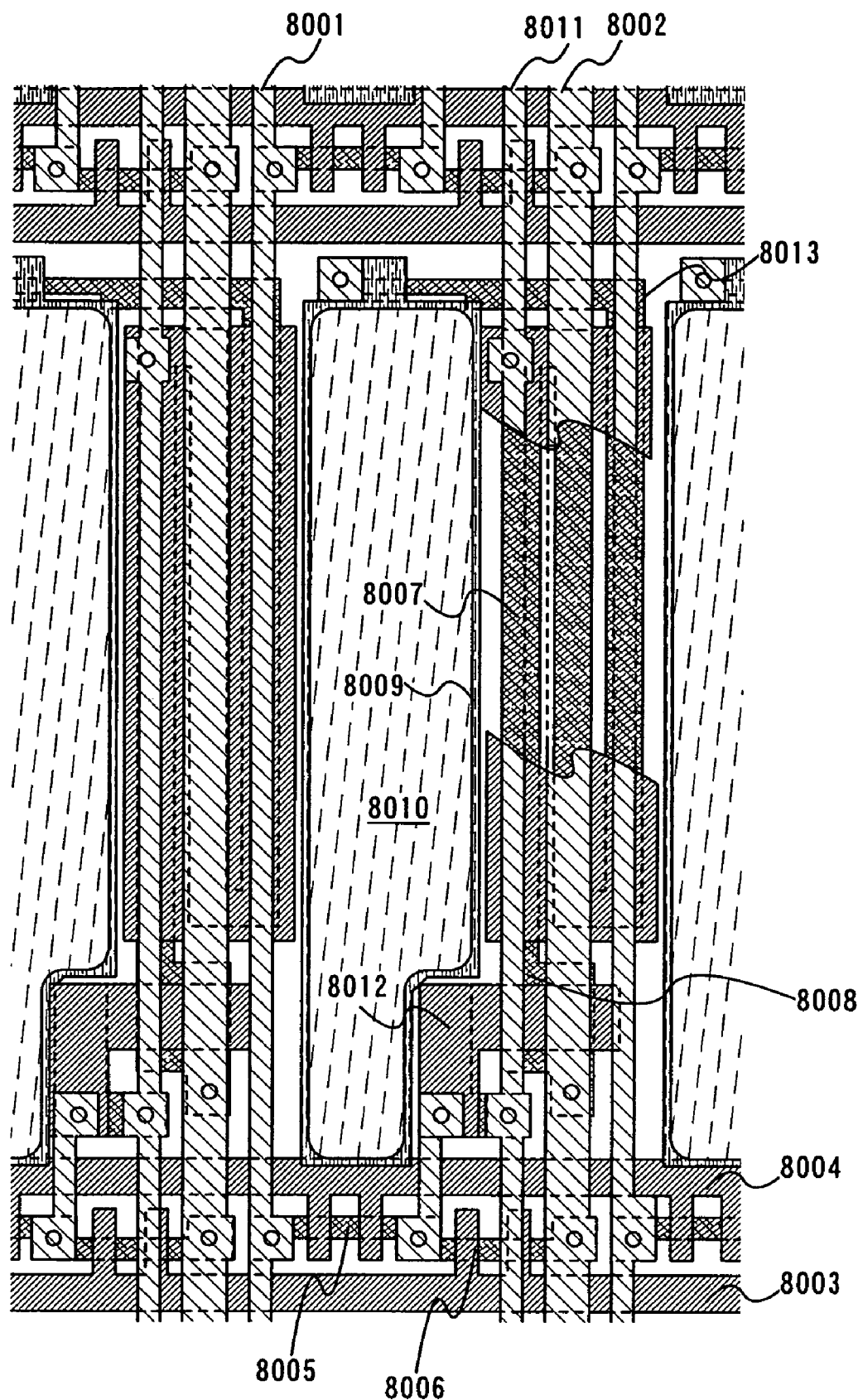
FIG. 3 is a mask layout diagram.

Described with reference to FIG. 3 is a mask layout of a pixel corresponding to the equivalent circuit shown in FIG. 2A, in which a resistor element is used as a protection means. A pixel shown in FIG. 3 comprises a signal line 8001, a power supply line 8002, scan lines 8003 and 8004, a switching transistor 8005, an erasing transistor 8006, a driving transistor 8007, a current controlling transistor 8008, a pixel electrode 8009, a lighting area (light emitting area) 8010, a power supply line 8011, a capacitor 8012, and a resistor element (resistor) 8013. The signal line 8001 and the power supply lines 8002 and 8011 are formed of a conductive material of the same layer. Further, the scan lines 8003 and 8004 are formed of a conductive material of the same layer.

Figure 18:
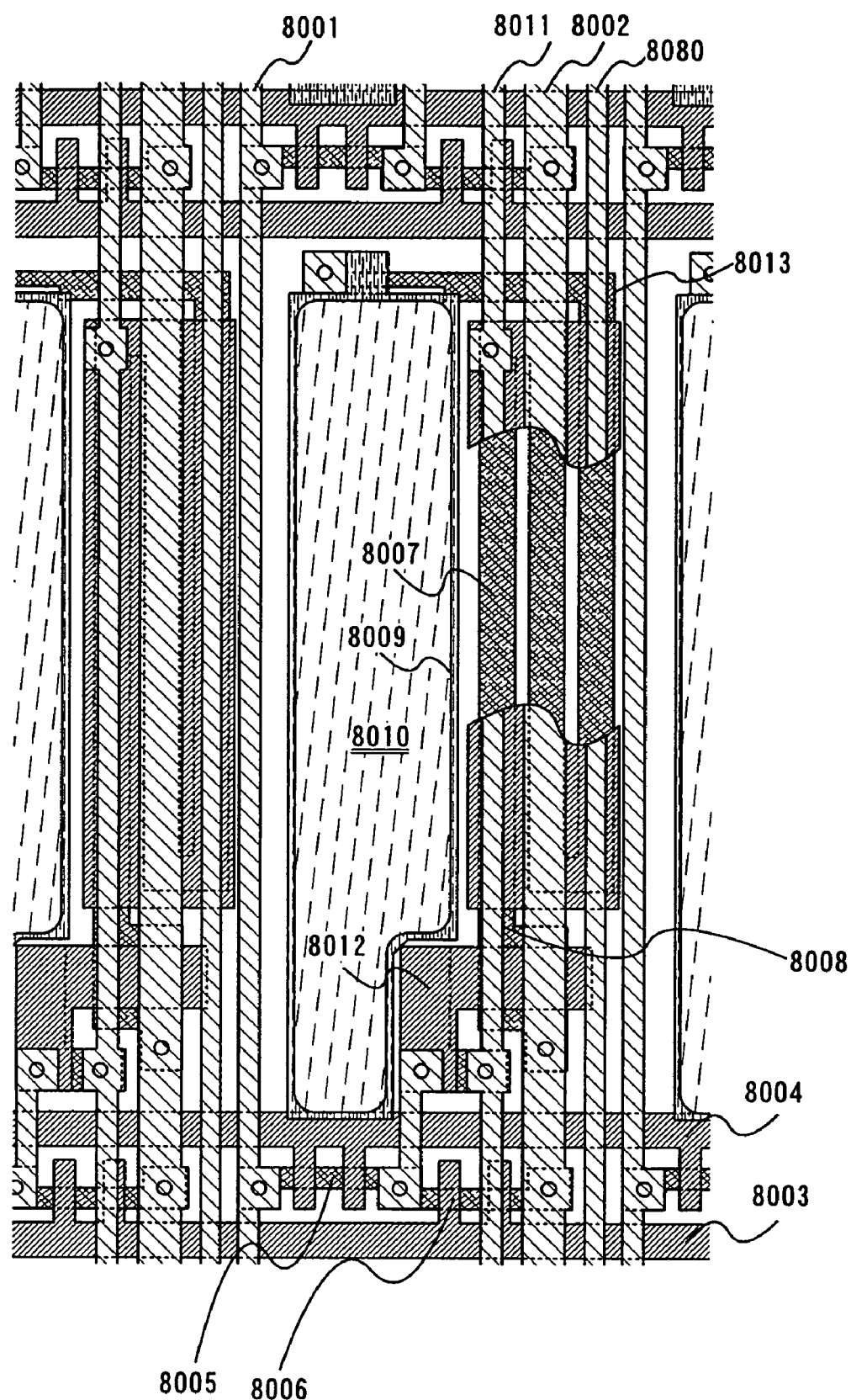
FIG. 18 is a mask layout diagram.

FIG. 18 shows another example of the mask layout of FIG. 3, to which an auxiliary wiring 8080 arranged in columns is added. A pixel shown in FIG. 18 has the same configuration as that in FIG. 3 except that the auxiliary wiring 8080 is additionally provided, therefore the description thereof is omitted herein.

Figure 4:
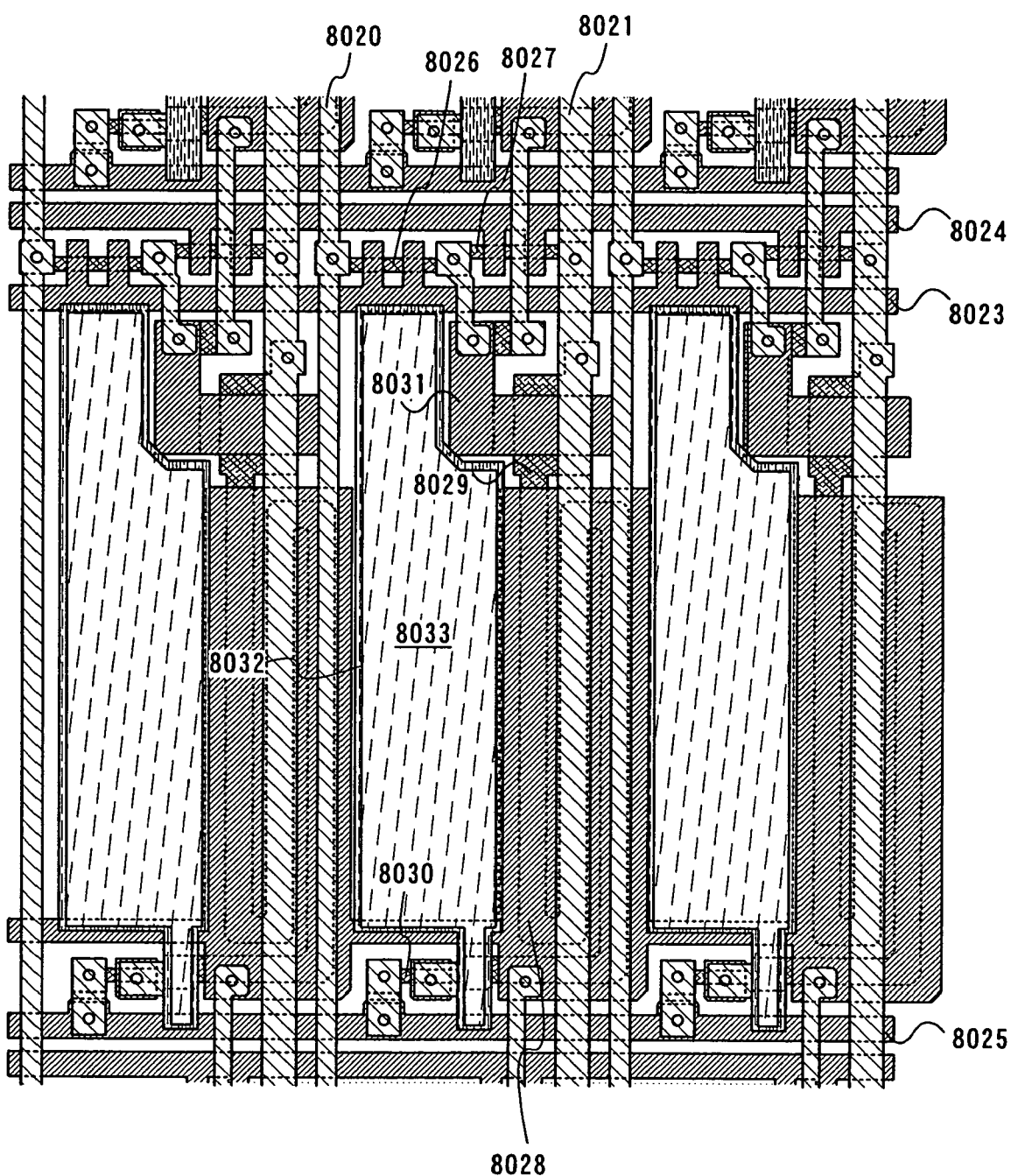
FIG. 4 is a mask layout diagram.

Described next is a mask layout of a pixel which uses a diode-connected transistor as a protection means. Described with reference to FIG. 4 is a mask layout of a pixel corresponding to the equivalent circuit diagram shown in FIG. 2B, in which a power supply line 8025 is additionally provided. A pixel shown in FIG. 4 comprises a signal line 8020, a power supply line 8021, scan lines 8023 and 8024, a power supply line 8025, a switching transistor 8026, an erasing transistor 8027, a driving transistor 8028, a current controlling transistor 8029, a protection transistor 8030, a capacitor 8031, a pixel electrode 8032, and a lighting area (light emitting area) 8033. The signal line 8020 and the power supply line 8021 are formed of a conductive material of the same layer. Further, the scan lines 8023 and 8024 and the power supply line 8025 are formed of a conductive material of the same layer.

Figure 5:
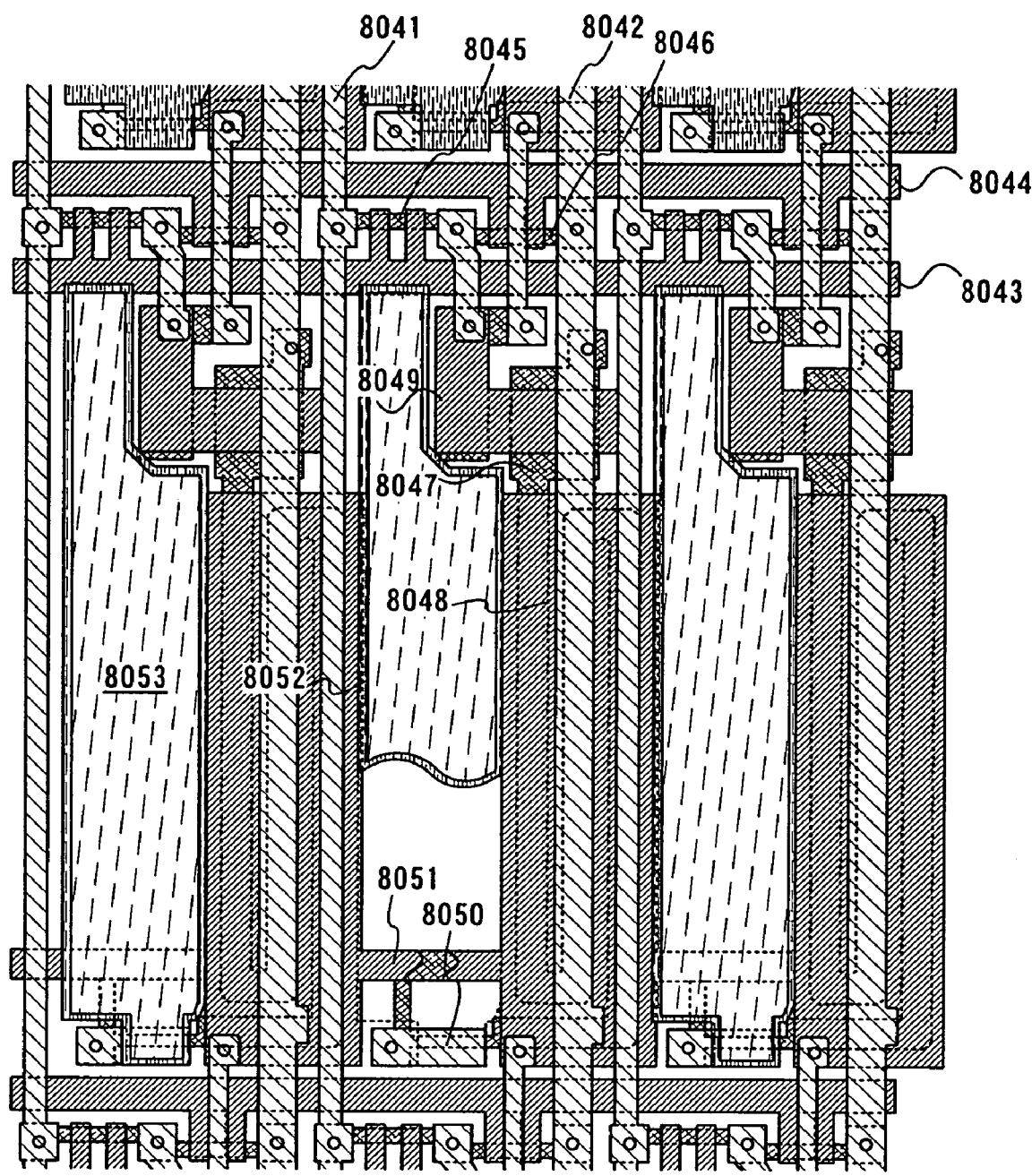
FIG. 5 is a mask layout diagram.

Described with reference to FIG. 5 is a mask layout of a pixel corresponding to the equivalent circuit diagram shown in FIG. 2B, in which a capacitor element and a resistor element are used as a protection means. A pixel shown in FIG. 5 comprises a signal line 8041, a power supply line 8042, scan lines 8043 and 8044, a switching transistor 8045, an erasing transistor 8046, a current controlling transistor 8047, a driving transistor 8048, a capacitor 8049, a resistor element (resistor) 8050, a capacitor element (capacitor) 8051, a pixel electrode 8052, and a lighting area (light emitting area) 8053. The signal line 8041 and the power supply line 8042 are formed of a conductive material of the same layer. Further, the scan lines 8043 and 8044 are formed of a conductive material of the same layer.

Figure 10:
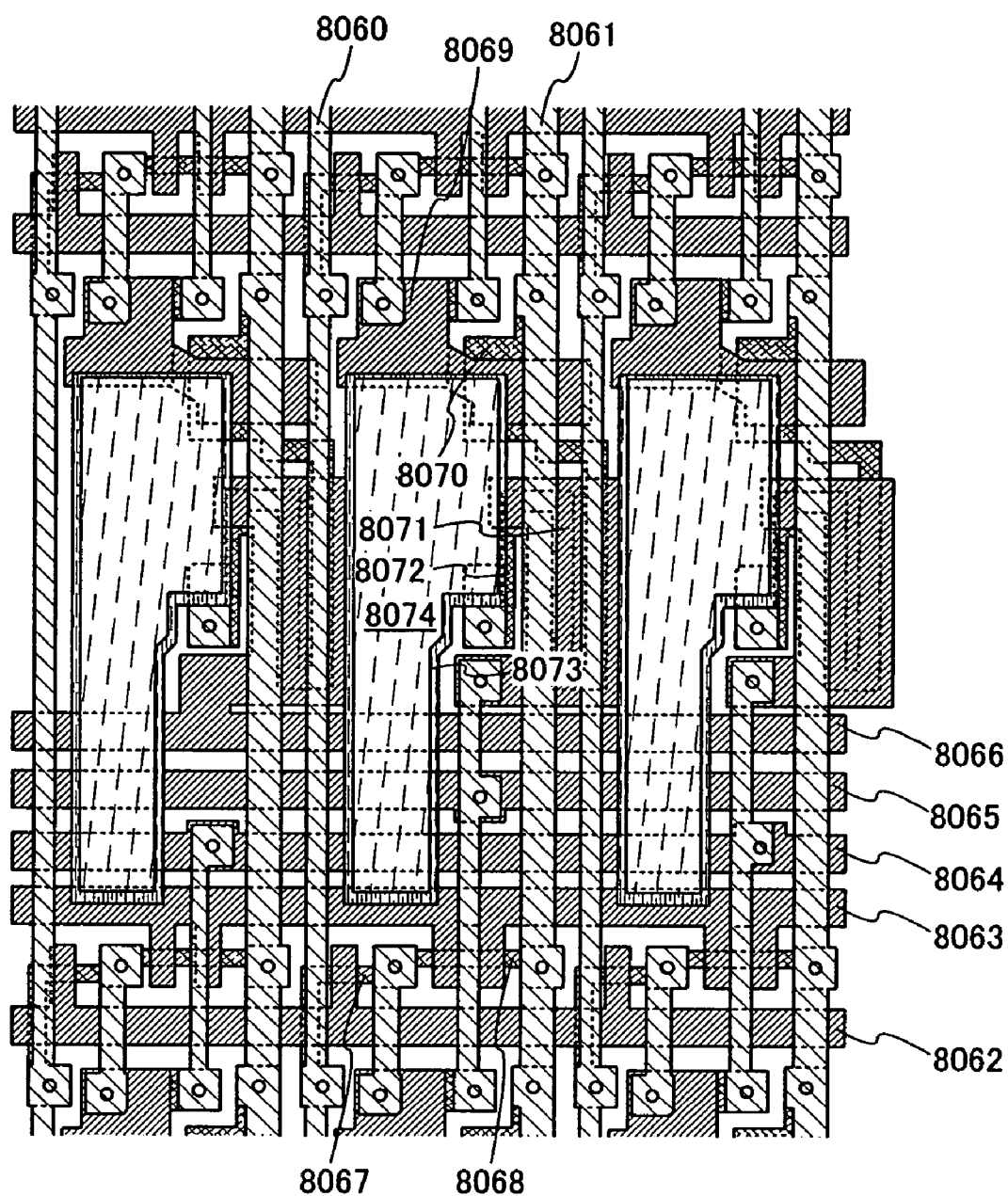
FIG. 10 is a mask layout diagram.
Figure 11:
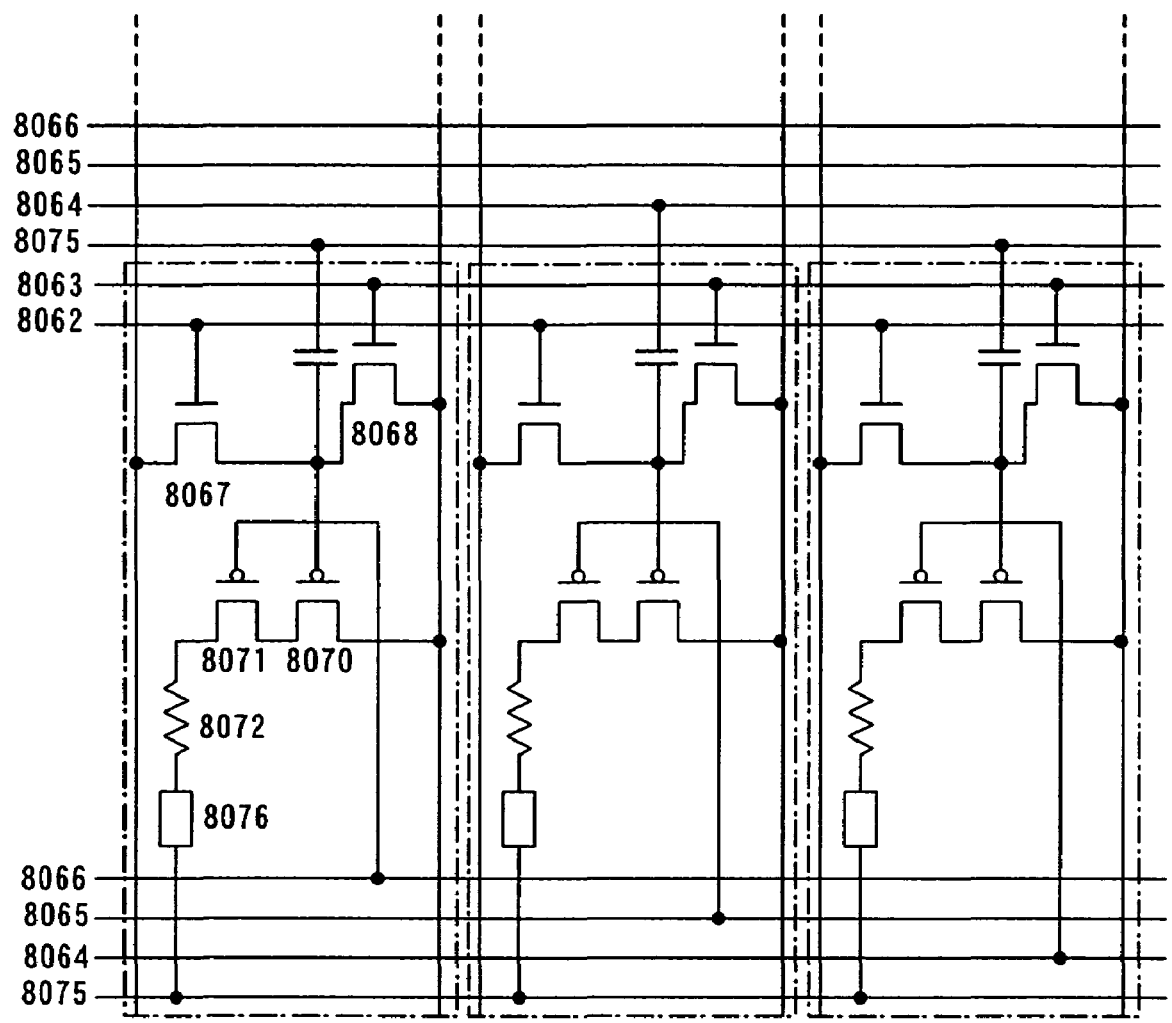
FIG. 11 is a circuit diagram of a pixel included in the semiconductor device of the invention.

Described with reference to FIG. 10 is a mask layout of a pixel corresponding to the equivalent circuit diagram shown in FIG. 11, in which a resistor element is used as a protection means. A pixel shown in FIG. 10 comprises a signal line 8060, a power supply line 8061, scan lines 8062 and 8063, power supply lines 8064 to 8066, a switching transistor 8067, an erasing transistor 8068, a capacitor 8069, a current controlling transistor 8070, a driving transistor

8071, a resistor element (resistor) 8072, a pixel electrode 8073, and a lighting area (light emitting area) 8074. The signal line 8060 and the power supply line 8061 are formed of a conductive material of the same layer. Further, the scan lines 8062 and 8063 and the power supply lines 8064 to 8066 are formed of a conductive material of the same layer. In an equivalent circuit diagram shown in FIG. 11, a light emitting element 8076 is connected to a cathode line 8075.

Figure 19:
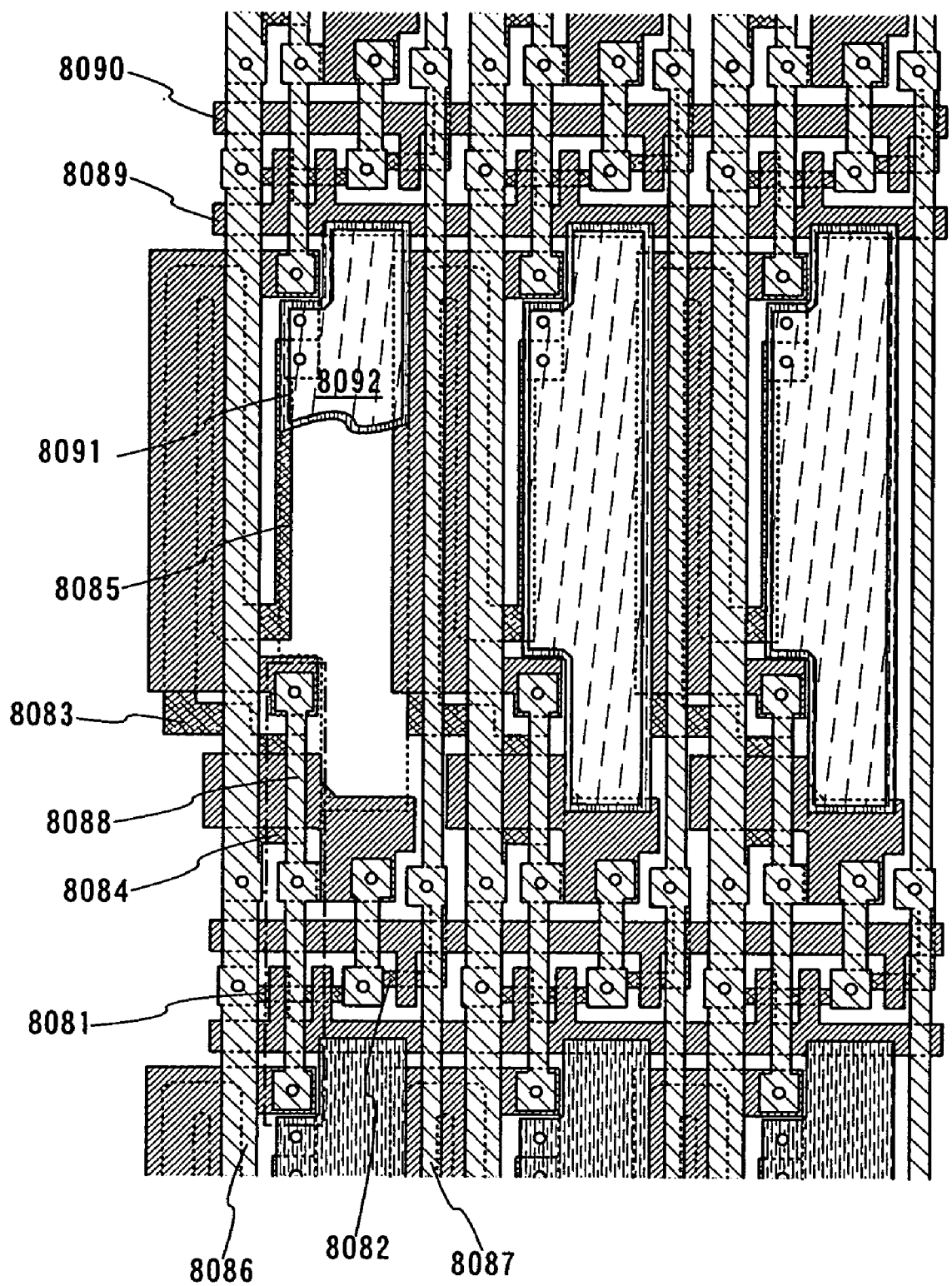
FIG. 19 is a mask layout diagram.

Described with reference to FIG. 19 is a mask layout of a pixel corresponding to the equivalent circuit diagram shown in FIG. 2A, in which a resistor element is used as a protection means. A pixel shown in FIG. 19 comprises a signal line 8086, power supply lines 8087 and 8088, scan lines 8089 and 8090, a switching transistor 8081, an erasing transistor 8082, a current controlling transistor 8084, a driving transistor 8083, a resistor element 8085, a pixel electrode 8091, and a lighting area (light emitting area) 8092. The signal line 8086 and the power supply lines 8087 and 8088 are formed of a conductive material of the same layer. Further, the scan lines 8089 and 8090 are formed of a conductive material of the same layer. One of the features of this layout diagram is that the power supply line 8088 is disposed around half as long as the longitudinal direction of a pixel pitch instead of disposing one wiring in columns, and electrically connected to a gate electrode of the driving transistor 8083.

In the pixels shown in FIGS. 3 to 5, 10, 11, 18, and 19, an active layer of the driving transistor is curved so that the ratio L/W thereof is higher than that of the current controlling transistor. An electro luminescent layer and a counter electrode (both not shown) are provided over the pixel electrode, and an overlapping area thereof corresponds to a lighting area. For the wirings arranged in columns, a single layer or a plurality of layers formed of a material such as aluminum (Al), titanium (Ti) and compound thereof may be used.

This embodiment can be implemented in combination with the aforementioned embodiment modes.

[Embodiment 2]

In this embodiment, a cross sectional structure of the driving transistor and the light emitting element shown in FIGS. 3 to 5 is described with reference to FIGS. 6A and 6B.

Figure 6A:
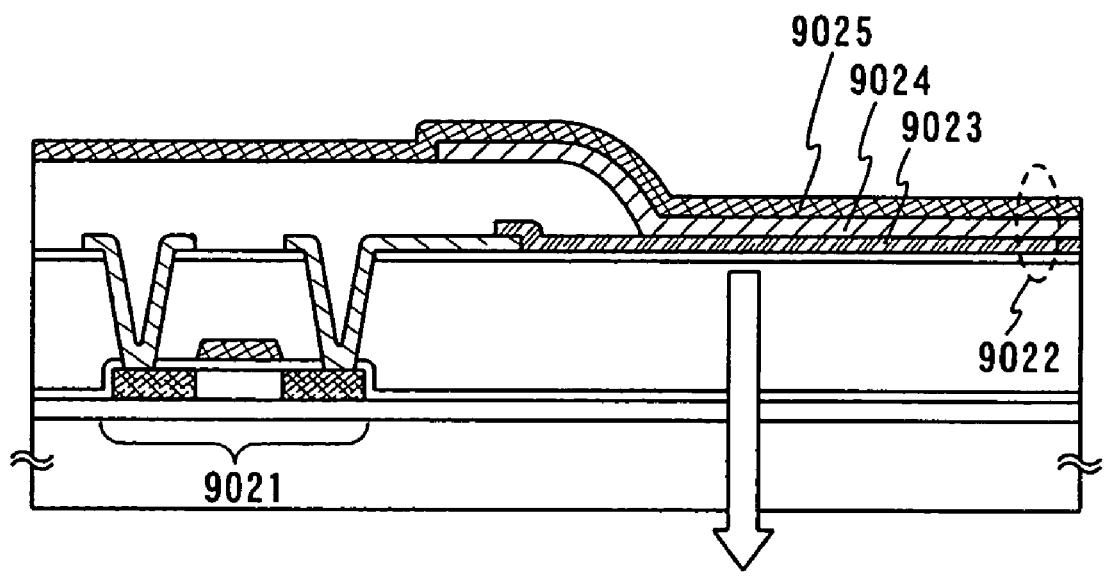
FIGS. 6A and 6B are cross sectional views of a transistor and a light emitting element.

FIG. 6A is a cross sectional view showing a driving transistor 9021 which is a P-type transistor, and a light emitting element 9022 from which light is emitted in the direction of an anode 9023. The anode 9023 of the light emitting element 9022 is electrically connected to the driving transistor 9021, and an electro luminescent layer 9024 and a cathode 9025 are laminated in this order over the anode 9023. The cathode 9025 may be formed of a known material as far as it is a light reflective conductive film having a low work function. For example, Ca, Al, CaF, MgAg, AlLi and the like are preferably used for the cathode 9025. The electro luminescent layer 9024 may be formed of a single layer or a plurality of layers. In the case of forming the electro luminescent layer 9024 of a plurality of layers, a hole injecting layer, a hole transporting layer, a light emitting layer, an electron transporting layer, and an electron injecting layer are laminated in this order over the anode 9023, though not all of these layers are necessarily provided. The anode 9023 is formed of a light transmissive conductive film, for example, ITO, or a transparent conductive film of indium oxide added with 2 to 20% of zinc oxide (ZnO) may be used.

An overlapping area of the anode 9023, the electro luminescent layer 9024, and the cathode 9025 corresponds to a light emitting element 9022. In the pixel shown in FIG. 6A, light is emitted from the light emitting element 9022 to the direction of the anode 9023 as shown by an outline arrow.

Figure 6B:
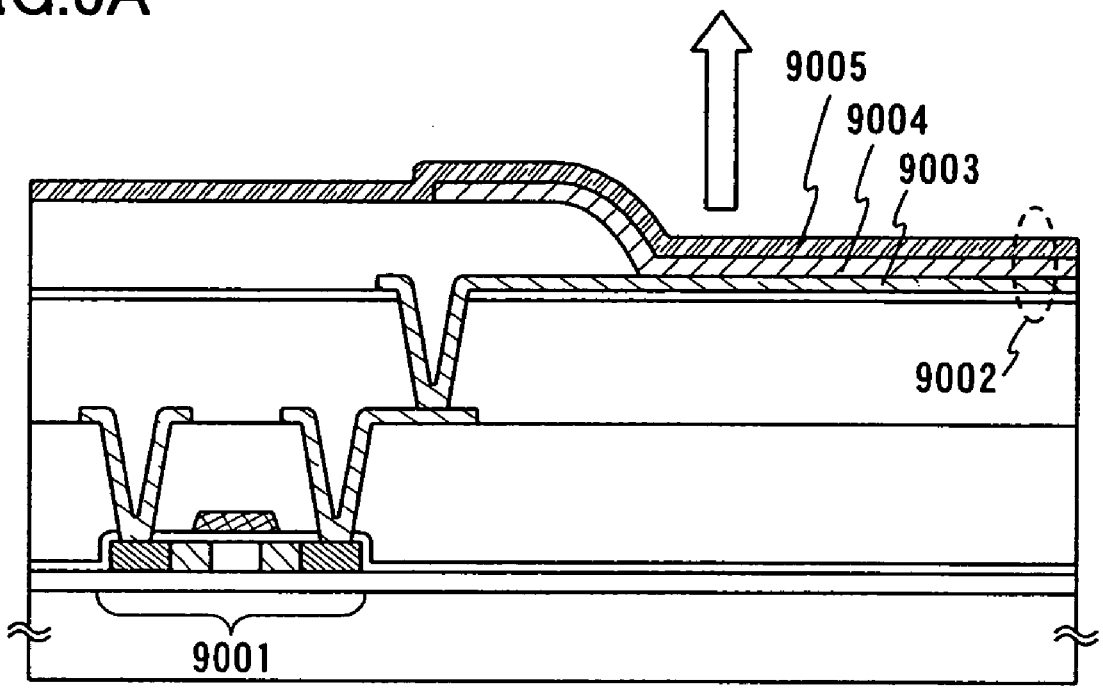

FIG. 6B is a cross sectional view showing a driving transistor 9001 which is an N-type transistor, and a light emitting element 9002 from which light is emitted in the direction of an anode 9005. A cathode 9003 of the light emitting element 9002 is electrically connected to the driving transistor 9001, and an electro luminescent layer 9004 and the anode 9005 are laminated in this order over the cathode 9003. The cathode 9003 may be formed of a known material as far as it is a light reflective conductive film having a low work function. For example, Ca, Al, CaF, MgAg, AlLi and the like are preferably used for the cathode 9003. The electro luminescent layer 9004 may be formed of a single layer or a plurality of layers. In the case of forming the electro luminescent layer 9004 of a plurality of layers, an electron injecting layer, an electron transporting layer, a light emitting layer, a hole transporting layer, and a hole injecting layer are laminated in this order over the cathode 9003, though not all of these layers are necessarily provided. The cathode 9005 is formed of a light transmissive conductive film.

An overlapping area of the cathode 9003, the electro luminescent layer 9004, and the anode 9005 corresponds to the light emitting element 9002. In the pixel shown in FIG. 6B, light is emitted from the light emitting element 9002 in the direction of the anode 9005 as shown by an outline arrow.

Although light from a light emitting element is emitted in the direction of an anode only in this embodiment, the invention is not limited to this. By employing a light transmissive material for a pair of electrodes of a light emitting element, light may be emitted in both directions of an anode and a cathode.

This embodiment can be implemented in combination with the aforementioned embodiment modes and embodiment.

[Embodiment 3]

Figures 7A, 7B:
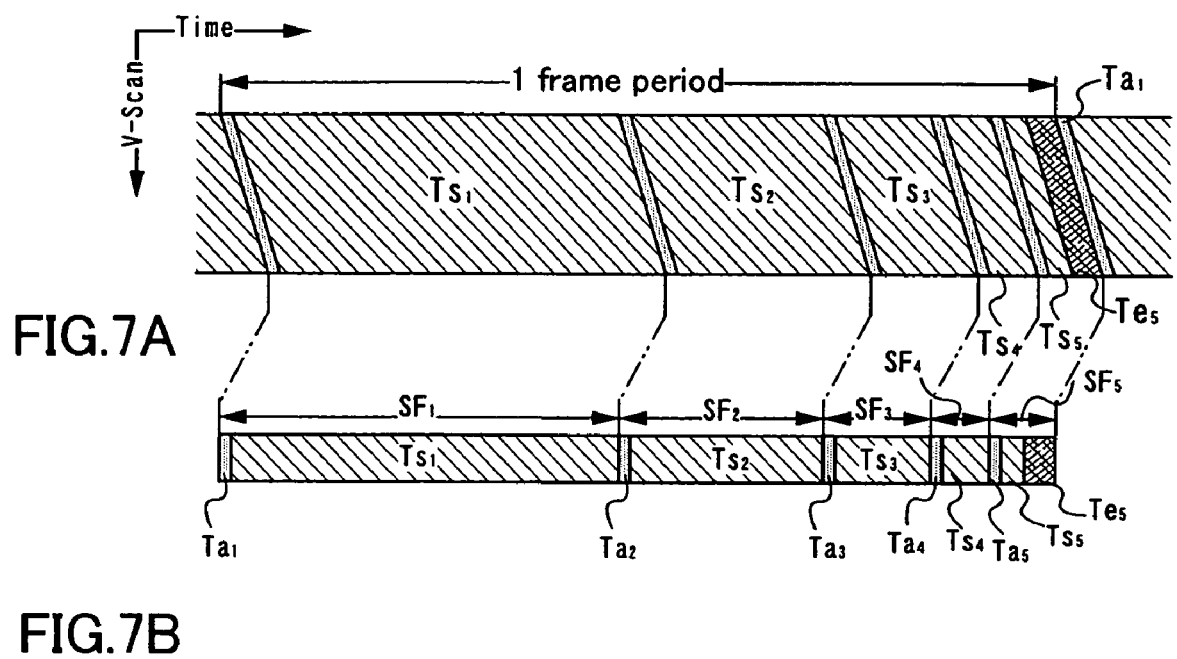
FIGS. 7A and 7B are timing charts.

In the case where the semiconductor device of the invention is operated by digital driving method, time gray scale is preferably used for displaying images with multi-level gray scale. In this embodiment, the time gray scale is described. FIG. 7A is a timing chart whose ordinate represents scan lines and abscissa represents time. FIG. 7B is a timing chart of a scan line of j-th row.

The semiconductor device has a frame frequency of approximately 60 Hz herein. That is, writing of image data is performed 60 times per second, and a period of writing image once is referred to as a frame period. In the time gray scale, a frame period is divided into a plurality of subframe periods. The number of divisions is equal to the number of bits in many cases, and such a case is described herein for simplicity. That is, as 5-bit gray scale is shown as an example in this embodiment, a frame period is divided into five subframe periods SF1 to SF5. Each subframe period comprises an address period Ta for writing a video signal to a pixel, and a sustain period Ts for lighting or non-lighting the pixel. The ratio of the sustain periods Ts1 to Ts5 is set as Ts1: . . . :Ts5=16:8:4:2:1. In other words, when displaying an image with n-bit gray scale, the ratio of n sustain periods is $2^{(n-1)}:2^{(n-2)}: \ldots :2^1:2^0$.

A subframe period having a shorter lighting period than a writing period (the subframe period SF5 herein) has an erasing period Te5. During the erasing period Te5, a video signal which has been written to a pixel is reset and a light emitting element is forcibly reset in order that the next period does not start shortly after a lighting period.

When the number of display gray scale levels has to be increased, the number of subframes may be increased. The order of subframe periods is not necessarily arranged from the most significant bit to the least significant bit, and it may be arranged at random in a frame period. Further, the order of subframe periods may be changed per frame period.

This embodiment can be implemented in combination with the aforementioned embodiment modes and embodiments.

[Embodiment 4]

In this embodiment, an operation of the semiconductor device of the invention is described with reference to FIGS. 20A to 20C. More specifically, an operation of the pixel circuit shown in FIG. 2A in each period of writing, data holding, and erasing is described. It is to be noted that a dashed line in the diagram shows a direction of a current flow.

Figure 20A:
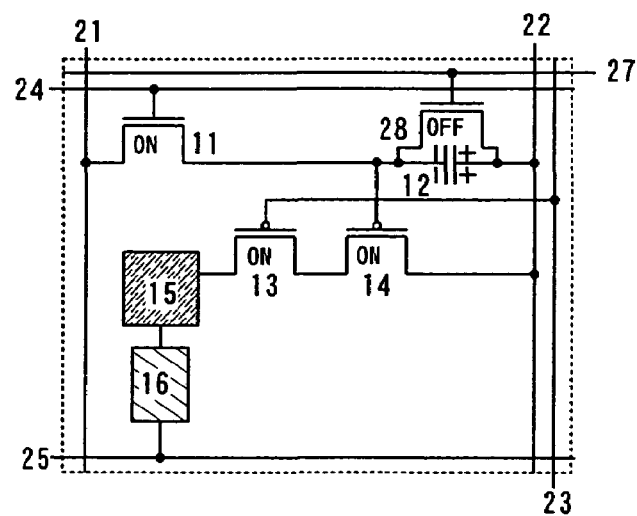
FIGS. 20A to 20C are diagrams showing operations of a pixel.

First, an operation in a writing period is explained (FIG. 20A). During a writing period, the scan line 24 is selected to turn the transistor 110N. A video signal inputted to the signal line 21 is inputted to a gate electrode of the transistor 14 via the transistor 11. A gate electrode of the transistor 13 is connected to the power supply line 23 and is in ON state all the time. When the transistor 14 is turned ON by a video signal, a current is supplied to the light emitting element 16 via the power supply line 22. Since the transistor 14 is operated in a linear region at this time, the amount of current flowing in the light emitting element 16 is determined by voltage-current characteristics of the light emitting element 16 and the transistor 13 operated in a saturation region. Then, the light emitting element 16 emits light at a luminance corresponding to the amount of supplied current. Meanwhile, when the transistor 14 is turned OFF by a video signal, no current is supplied to the light emitting element 16 and thus the light emitting element 16 emits no light.

Figure 20B:
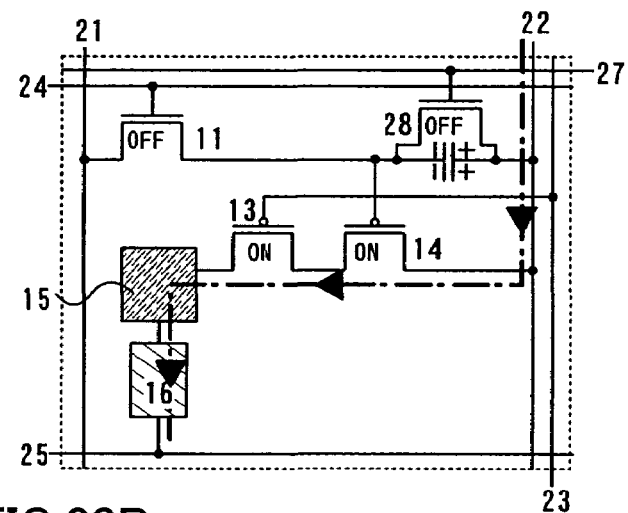

Next, an operation in a data holding period is explained (FIG. 20B). During a data holding period, the transistor 11 is turned OFF by controlling a potential of the scan line 24, thereby holding a video signal potential that has been written in the writing period. Whether the light emitting element 16 emits light or not is controlled in accordance with the video signal potential.

Figure 20C:
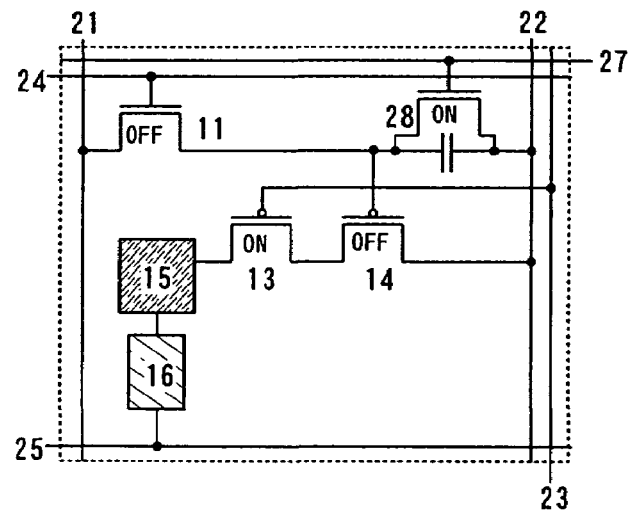

Finally, an operation in an erasing period is explained (FIG. 20C). During an erasing period, the transistor 28 is turned ON, and a potential of the power supply line 22 is supplied to the gate electrode of the transistor 14 via the transistor 28. Accordingly, the transistor 14 is turned OFF, and current supply to the light emitting element 16 is forcibly stopped.

This embodiment can be implemented in combination with the aforementioned embodiment modes and embodiments.

[Embodiment 5]

Figure 8A:
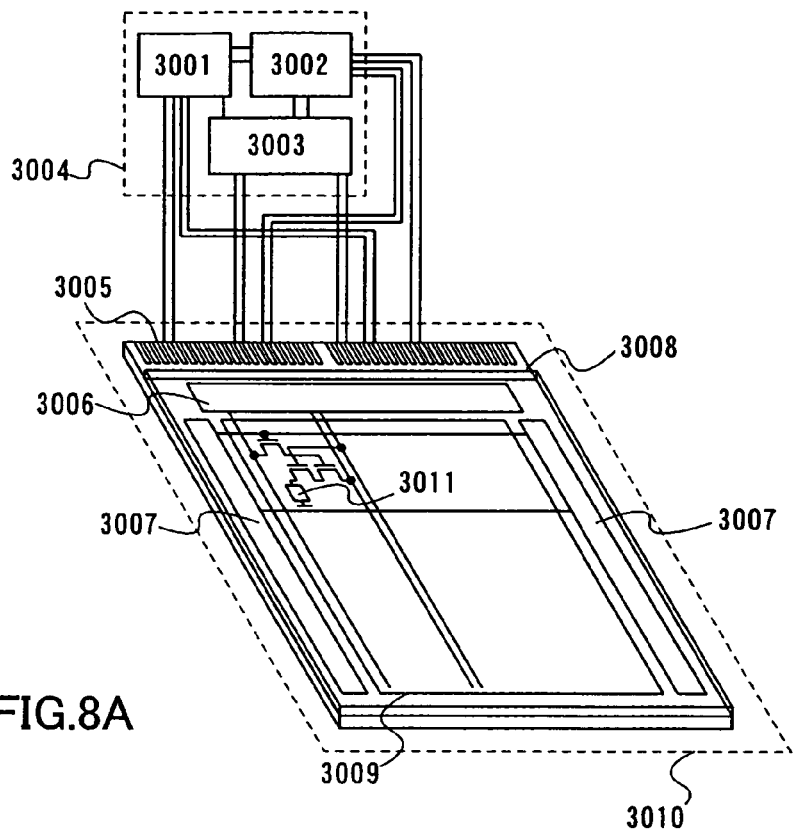
FIGS. 8A to 8C are diagrams showing configurations of a panel and a driving circuit.

Described with reference to FIG. 8A are a schematic view of a panel formed by using the pixel configuration of the invention and an external circuit connected to this panel.

A panel 3010 is connected to an external circuit 3004 which comprises an A/D conversion portion 3001, a power supply portion 3002 and a signal generating portion 3003. In the A/D conversion portion 3001, an image data signal inputted in an analog manner is converted to a digital signal (video signal) and supplied to a signal line driving circuit 3006. In the power supply portion 3002, power having a desired voltage is generated from a power supply of a battery or an outlet, and supplied to the signal line driving circuit 3006, a scan line driving circuit 3007, a light emitting element 3011, the signal generating portion 3003 and the like. In the signal generating portion 3003, various signals such as a power supply, an image signal and a synchronous signal are inputted and converted, and a clock signal and the like for driving the signal line driving circuit 3006 and the scan line driving circuit 3007 are generated. The signals and power supplies of the external circuit 3004 are inputted to an internal circuit and the like from an FPC connecting portion 3005 of the panel 3010 via an FPC. The panel 3010 includes the FPC connecting portion 3005 and the internal circuit which are formed on the substrate 3008. The internal circuit includes the signal line driving circuit 3006, the scan line driving circuit 3007 and a pixel portion 3009.

Note that, a CPU, a controller and the like may be integrally formed on the substrate as well as the scan line driving circuit and the signal line driving circuit. According to this, the number of external circuits (ICs) to connect is reduced, resulting in reduction in weight and thickness. This structure is effectively applied to a portable terminal and the like in particular.

Figure 8B:
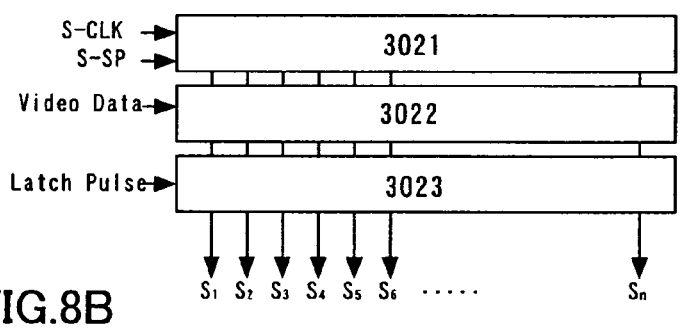
Figure 8C:
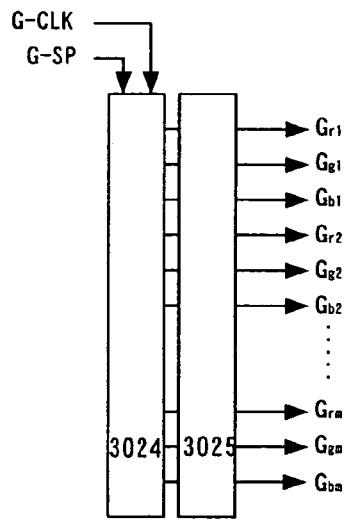

Configuration examples of the signal line driving circuit 3006 and the scan line driving circuit 3007 are described hereinafter with reference to FIGS. 8B and 8C respectively. The signal line driving circuit 3006 comprises a shift register 3021, a first latch circuit 3022 and a second latch circuit 3023. The scan line driving circuit 3007 comprises a shift register 3024 and a buffer 3025. The invention, however, is not limited to this structure, and the signal line driving circuit 3006 may have a level shifter and a buffer, or the scan line driving circuit 3007 may have a level shifter between the shift register 3024 and the buffer 3025, for example. By adding a level shifter, voltage amplitude between a logic circuit portion and a buffer portion can be changed.

This embodiment can be implemented in combination with the aforementioned embodiment modes and embodiments.

[Embodiment 6]

Figure 21A:
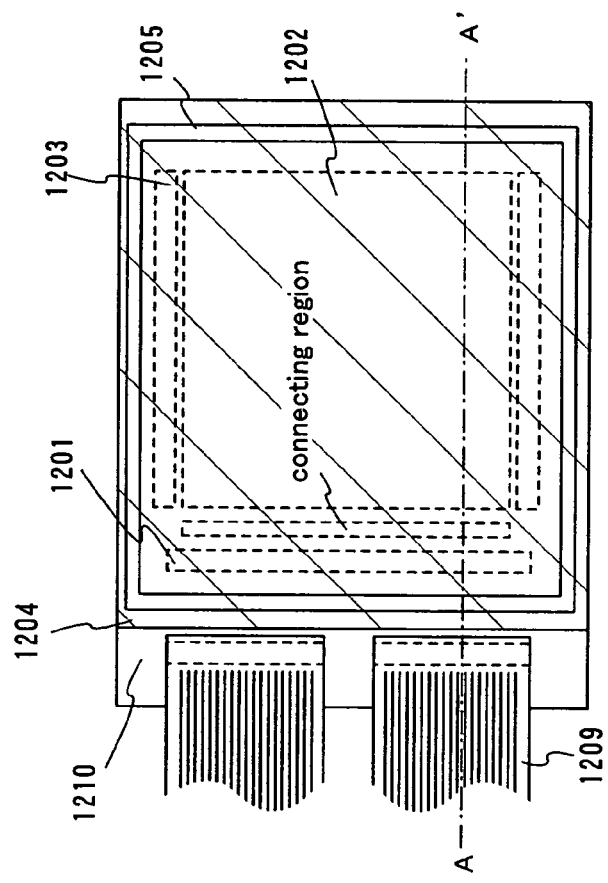
FIGS. 21A and 21B are diagrams each showing a panel.
Figure 21B:
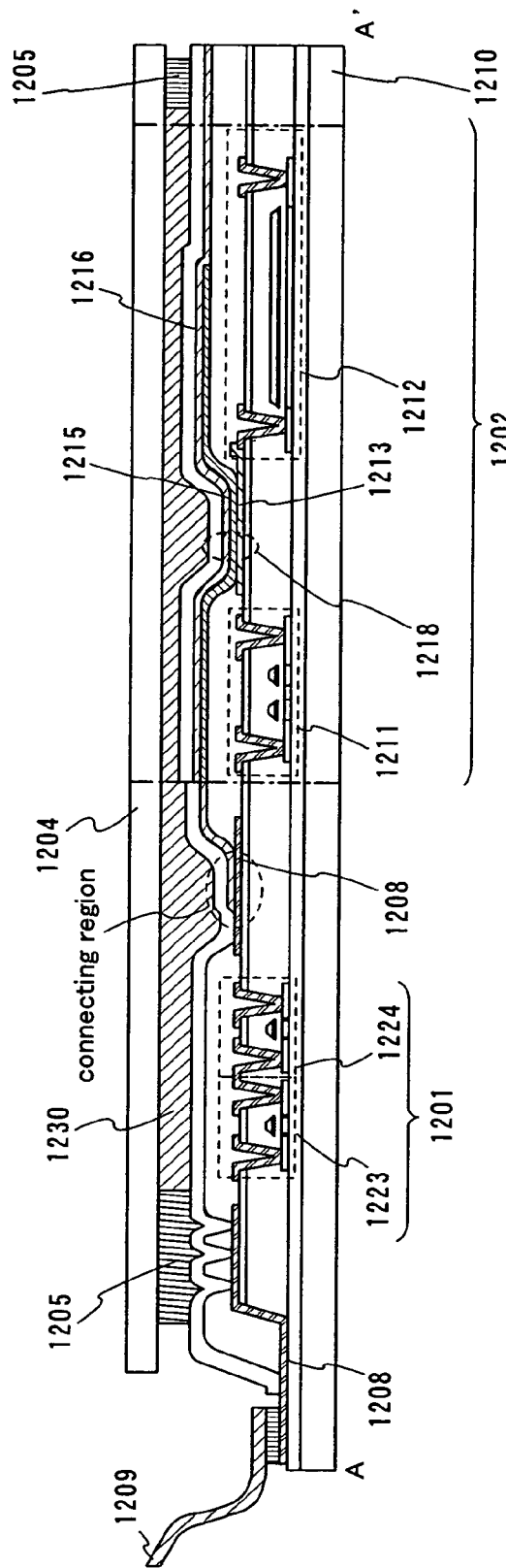

An embodiment of the invention is described with reference to FIGS. 21A and 21B. FIG. 21A is a top plan view of a panel formed by sealing a substrate including TFTs with a sealing material. FIG. 21B is a cross sectional view along a line A–A' of FIG. 21A.

FIG. 21A is a top plan view of a panel. A pixel portion (display portion) 1202 is formed on a first substrate 1210, a signal line driving circuit 1201 and a scan line driving circuit 1203 are formed at the periphery of the pixel portion 1202, and a sealing material 1205 is provided so as to surround these driving circuits. The aforementioned embodiment modes can be applied to the configuration of the pixel portion 1202. For the sealing material 1205, glass, metal (typically, stainless), ceramics, or plastic (including plastic film) is used.

The sealing material 1205 may be overlapped with a part of the signal line driving circuit 1201 and the scan line driving circuit 1203. A second substrate 1204 is formed by means of the sealing material 1205. The first substrate 1210 includes an input terminal portion for transmitting a signal to the signal line driving circuit 1201 and the scan line driving circuit 1203, and a data signal such as a video signal is inputted to the input terminal portion via an FPC 1209.

FIG. 21B is a cross sectional view of the panel. The pixel portion 1202 and the signal line driving circuit 1201 are formed over the first substrate 1210. The pixel portion 1202 comprises a switching TFT 1211, a driving TFT 1212 and a light emitting element 1218 including a first electrode 1213, an organic compound layer 1215 and a second electrode 1216. The signal line driving circuit 1201 comprises an N-channel TFT 1223 and a P-channel TFT 1224. Further, an area surrounded by the first substrate 1210, the sealing material 1205 and the second substrate 1204 is filled with a water-absorbing resin 1230. The resin 1230 may be coated by a spinner and allows the panel to be reduced in thickness.

The semiconductor device of the invention includes a panel in which a driving circuit and a pixel portion comprising a light emitting element are sealed between a substrate and a cover material, a module in which an IC and the like are mounted on the panel, a display used as a display device, and the like. That is, the semiconductor device is a generic term used to refer to a panel, a module, a display and the like.

This embodiment can be implemented in combination with the aforementioned embodiment modes and embodiments.

[Embodiment 7]

The invention can be applied to various electronic apparatuses such as a digital camera, an audio reproducing device such as a car audio system, a notebook personal computer, a game machine, a portable information terminal (a mobile phone, a portable game machine and the like), and an image reproducing device provided with a recording medium (a home video game machine and the like). Specific examples of them are shown in FIGS. 9A to 9H.

Figure 9A:
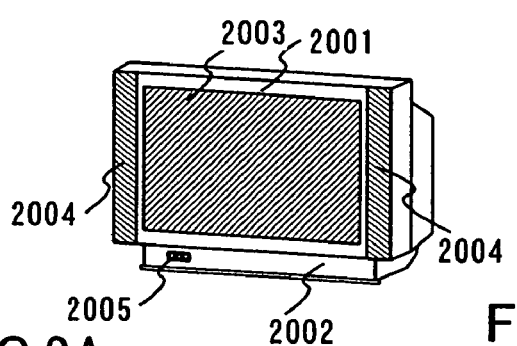
FIGS. 9A to 9H are views showing electronic apparatuses using the invention.
Figure 9B:
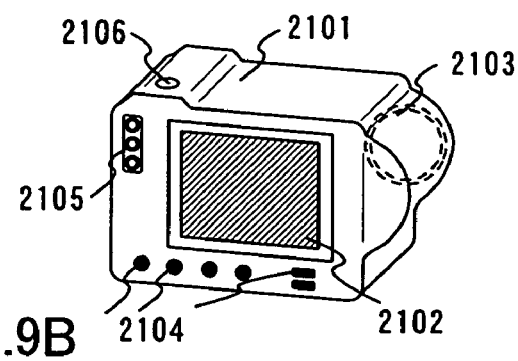
Figure 9C:
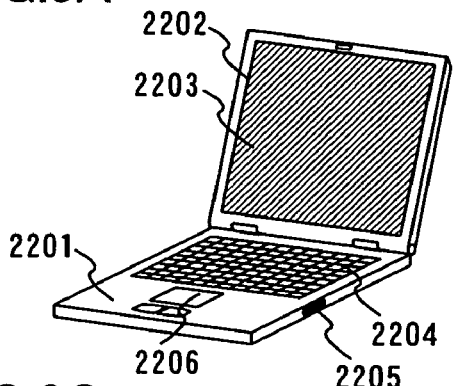

FIG. 9A shows a display device which includes a housing 2001, a support base 2002, a display portion 2003, speaker portions 2004, a video input terminal 2005 and the like. FIG. 9B shows a digital still camera which includes a main body 2101, a display portion 2102, an image receiving portion 2103, operation keys 2104, an external connecting port 2105, a shutter 2106 and the like. FIG. 9C shows a notebook personal computer which includes a main body 2201, a housing 2202, a display portion 2203, a keyboard 2204, an external connecting port 2205, a pointing mouse 2206 and the like.

Figure 9D:
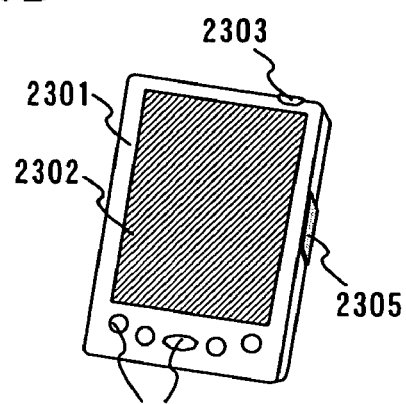
Figure 9E:
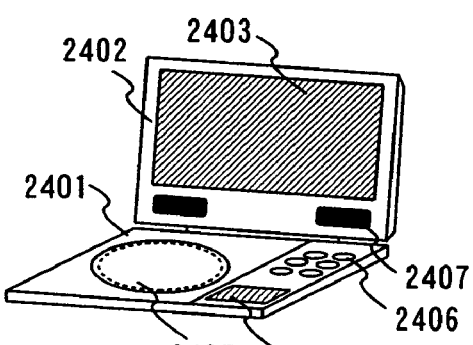
Figure 9F:
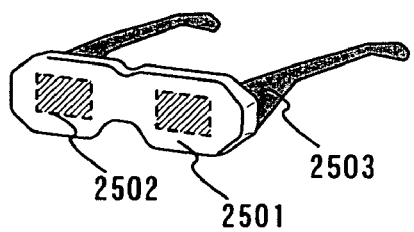

FIG. 9D shows a mobile computer which includes a main body 2301, a display portion 2302, a switch 2303, operation keys 2304, an infrared port 2305 and the like. FIG. 9E shows a mobile image reproducing device provided with a recording medium, which includes a main body 2401, a housing 2402, a display portion A 2403, a display portion B 2404, a recording medium reading portion 2405, an operation key 2406, a speaker portion 2407 and the like. The display portion A 2403 displays mainly image information and the display portion B 2404 displays mainly character information. FIG. 9F shows a goggle type display which includes a main body 2501, a display portion 2502, an arm portion 2503 and the like.

Figure 9G:
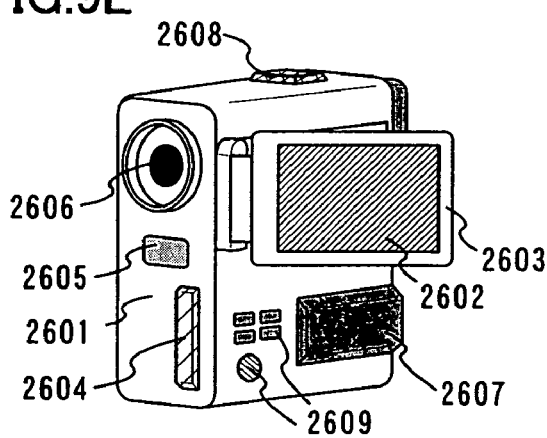
Figure 9H:
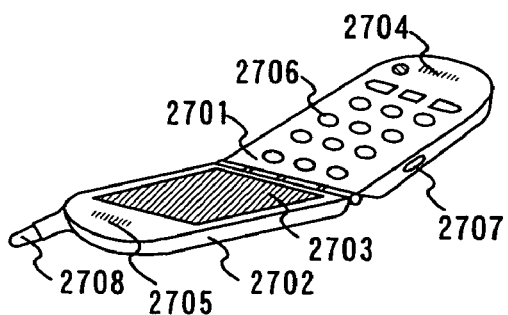

FIG. 9G shows a video camera which includes a main body 2601, a display portion 2602, a housing 2603, an external connecting port 2604, a remote control receiving portion 2605, an image receiving portion 2606, a battery 2607, an audio input portion 2608, operation keys 2609 and the like. FIG. 9H shows a mobile phone which includes a main body 2701, a housing 2702, a display portion 2703, an audio input portion 2704, an audio output portion 2705, an operation key 2706, an external connecting port 2707, an antenna 2708 and the like.

This embodiment can be implemented in combination with the aforementioned embodiment modes and embodiments.

According to the invention adopting the aforementioned structures, sudden changes in potential of a source electrode or a drain electrode of a transistor due to electric charges built up on a pixel electrode are mitigated and electrostatic discharge damage is thus prevented. Further, the invention prevents electrostatic discharge damage during manufacturing steps, in particular, during a step in which the formation of a pixel electrode is completed.

The invention adopting aforementioned structures provides a semiconductor device in which variations in luminance of light emitting elements due to variations in characteristics of driving transistors are reduced and image quality is thus improved, while not increasing capacitance of a capacitor element provided between a gate and a source of a driving transistor or lowering off-current of a switching transistor.

This application is based on Japanese Patent Application serial no. 2003-174041 filed in Japan Patent Office on 18th, Jun., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A semiconductor device comprising:
   a plurality of pixels each comprising:
   a light emitting element;
   a protection circuit;
   a first transistor for controlling the amount of current flowing in the light emitting element; and
   a second transistor for controlling a current supply to the light emitting element in accordance with a video signal,
   wherein the light emitting element, the protection circuit, the first transistor, and the second transistor are connected in series between a first power supply and a second power supply, and
   the protection circuit comprises at least one of a resistor element, a capacitor element and a rectifier element.

2. The semiconductor device according to claim 1, wherein the rectifier element is a diode.

3. The semiconductor device according to claim 1, wherein the rectifier element is a transistor whose gate electrode and drain electrode are connected to each other.

4. The semiconductor device according to claim 1, wherein the pixel comprises a switching transistor for controlling a video signal input.

5. The semiconductor device according to claim 1, wherein the pixel comprises an erasing transistor for discharging electric charges of a capacitor element disposed between a gate electrode and a source electrode of the second transistor.

6. The semiconductor device according to claim 1, wherein a ratio of a channel length $L_1$/a channel width $W_1$ of the first transistor to a channel length $L_2$/the channel width $W_2$ of the second transistor is set as $L_1/W_1:L_2/W_2=5$ to $6000:1$.

7. The semiconductor device according to claim 1, wherein the first transistor and the second transistor have the same conductivity.

8. The semiconductor device according to claim 1, the semiconductor device is used for an electronic apparatus selected from the group consist of a display device, a digital still camera, a note book personal computer, a mobile image reproducing device, a goggle type display, a video camera, and a mobile phone.

9. A semiconductor device comprising:
a plurality of pixels each comprising:
a light emitting element;
a protection circuit;
a first transistor for controlling the amount of current flowing in the light emitting element; and
a second transistor for controlling a current supply to the light emitting element in accordance with a video signal,
wherein the light emitting element, the protection circuit, the first transistor, and the second transistor are connected in series between a first power supply and a second power supply, and
the protection circuit is a resistor element connected in series to a pixel electrode.

10. The semiconductor device according to claim 9, wherein the pixel comprises a switching transistor for controlling a video signal input.

11. The semiconductor device according to claim 9, wherein the pixel comprises an erasing transistor for discharging electric charges of a capacitor element disposed between a gate electrode and a source electrode of the second transistor.

12. The semiconductor device according to claim 9, wherein a ratio of a channel length $L_1$/a channel width $W_1$ of the first transistor to a channel length $L_2$/the channel width $W_2$ of the second transistor is set as $L_1/W_1:L_2/W_2=5$ to 6000:1.

13. The semiconductor device according to claim 9, wherein the first transistor and the second transistor have the same conductivity.

14. The semiconductor device according to claim 9, the semiconductor device is used for an electronic apparatus selected from the group consist of a display device, a digital still camera, a note book personal computer, a mobile image reproducing device, a goggle type display, a video camera, and a mobile phone.

15. A semiconductor device comprising:
a plurality of pixels each comprising:
a light emitting element;
a protection circuit;
a first transistor for controlling the amount of current flowing in the light emitting element; and
a second transistor for controlling a current supply to the light emitting element in accordance with a video signal,
wherein the light emitting element, the protection circuit, the first transistor, and the second transistor are connected in series between a first power supply and a second power supply, and
the protection circuit is a capacitor element which discharges or charges electric charges built up on a pixel electrode.

16. The semiconductor device according to claim 15, wherein the pixel comprises a switching transistor for controlling a video signal input.

17. The semiconductor device according to claim 15, wherein the pixel comprises an erasing transistor for discharging electric charges of a capacitor element disposed between a gate electrode and a source electrode of the second transistor.

18. The semiconductor device according to claim 15, wherein a ratio of a channel length $L_1$/a channel width $W_1$ of the first transistor to a channel length $L_2$/the channel width $W_2$ of the second transistor is set as $L_1/W_1:L_2/W_2=5$ to 6000:1.

19. The semiconductor device according to claim 15, wherein the first transistor and the second transistor have the same conductivity.

20. The semiconductor device according to claim 15, the semiconductor device is used for an electronic apparatus selected from the group consist of a display device, a digital still camera, a note book personal computer, a mobile image reproducing device, a goggle type display, a video camera, and a mobile phone.

21. A semiconductor device comprising:
a plurality of pixels each comprising:
a light emitting element;
a protection circuit;
a first transistor for controlling the amount of current flowing in the light emitting element; and
a second transistor for controlling a current supply to the light emitting element in accordance with a video signal,
wherein the light emitting element, the protection circuit, the first transistor, and the second transistor are connected in series between a first power supply and a second power supply,
the protection circuit is a protection transistor whose gate electrode and drain electrode are connected to each other, and
the drain electrode or a source electrode of the protection transistor is connected to the first power supply.

22. The semiconductor device according to claim 21, wherein the pixel comprises a switching transistor for controlling a video signal input.

23. The semiconductor device according to claim 21, wherein the pixel comprises an erasing transistor for discharging electric charges of a capacitor element disposed between a gate electrode and a source electrode of the second transistor.

24. The semiconductor device according to claim 21, wherein a ratio of a channel length $L_1$/a channel width $W_1$ of the first transistor to a channel length $L_2$/the channel width $W_2$ of the second transistor is set as $L_1/W_1:L_2/W_2=5$ to 6000:1.

25. The semiconductor device according to claim 21, wherein the first transistor and the second transistor have the same conductivity.

26. The semiconductor device according to claim 21, the semiconductor device is used for an electronic apparatus selected from the group consist of a display device, a digital still camera, a note book personal computer, a mobile image reproducing device, a goggle type display, a video camera, and a mobile phone.

27. A semiconductor device comprising:
a plurality of pixels each comprising:
a light emitting element;
a protection circuit;
a first transistor for controlling the amount of current flowing in the light emitting element; and
a second transistor for controlling a current supply to the light emitting element in accordance with a video signal,
wherein the light emitting element, the protection circuit, the first transistor, and the second transistor are connected in series between a first power supply and a second power supply, and the protection circuit is a diode one electrode of which is connected to a pixel electrode and the other electrode of which is connected to a third power supply.

28. The semiconductor device according to claim 27, wherein the pixel comprises a switching transistor for controlling a video signal input.

29. The semiconductor device according to claim 27, wherein the pixel comprises an erasing transistor for discharging electric charges of a capacitor element disposed between a gate electrode and a source electrode of the second transistor.

30. The semiconductor device according to claim 27, wherein a ratio of a channel length $L_1$/a channel width $W_1$ of the first transistor to a channel length $L_2$/the channel width $W_2$ of the second transistor is set as $L_1/W_1:L_2/W_2=5$ to $6000:1$.

31. The semiconductor device according to claim 27, wherein the first transistor and the second transistor have the same conductivity.

32. The semiconductor device according to claim 27, the semiconductor device is used for an electronic apparatus selected from the group consist of a display device, a digital still camera, a note book personal computer, a mobile image reproducing device, a goggle type display, a video camera, and a mobile phone.

* * * * *